(12) United States Patent
Kamimura et al.

(10) Patent No.: US 6,939,208 B2
(45) Date of Patent: Sep. 6, 2005

(54) POLISHING APPARATUS

(75) Inventors: Kenji Kamimura, Tokyo (JP); Norio Kimura, Tokyo (JP); Satoshi Okamura, Tokyo (JP); Hideo Aizawa, Tokyo (JP); Makoto Akagi, Tokyo (JP); Katsuhiko Tokushige, Tokyo (JP); Hisanori Matsuo, Tokyo (JP); Manabu Tsujimura, Tokyo (JP)

(73) Assignee: Ebara Corporation, Tokyo (JP)

( * ) Notice: Subject to any disclaimer, the term of this patent is extended or adjusted under 35 U.S.C. 154(b) by 100 days.

(21) Appl. No.: 09/787,121

(22) PCT Filed: Jan. 22, 2001

(86) PCT No.: PCT/JP01/00382

§ 371 (c)(1),
(2), (4) Date: Mar. 14, 2001

(87) PCT Pub. No.: WO02/34467

PCT Pub. Date: May 2, 2002

(65) Prior Publication Data

US 2002/0164932 A1 Nov. 7, 2002

(30) Foreign Application Priority Data

Oct. 24, 2000 (JP) .......................................... 2000-32490

(51) Int. Cl.[7] ............................................... B24B 53/00

(52) U.S. Cl. ............................ 451/56; 451/72; 451/443

(58) Field of Search ............................ 451/56, 72, 444, 451/443, 288, 5, 21, 65

(56) References Cited

U.S. PATENT DOCUMENTS

| 5,486,131 | A | | 1/1996 | Cesna et al. |
| 5,681,212 | A | * | 10/1997 | Hayakawa et al. .......... 451/288 |
| 5,902,173 | A | * | 5/1999 | Tanaka ......................... 451/56 |
| 5,941,761 | A | * | 8/1999 | Nagahara et al. ........... 451/444 |
| 5,941,762 | A | | 8/1999 | Ravkin et al. |
| 5,990,010 | A | | 11/1999 | Berman |

FOREIGN PATENT DOCUMENTS

| EP | 0816017 A1 | 1/1998 |
| JP | 9-277157 | 10/1997 |
| JP | 9-314456 | 12/1997 |
| JP | 10-180618 | 7/1998 |
| JP | 10-202504 | 8/1998 |
| JP | 10-296616 | 11/1998 |
| JP | 11-277403 | 10/1999 |
| JP | 2000-271854 | 10/2000 |
| JP | 2001-38602 | 2/2001 |
| WO | 99/50024 | 10/1999 |

* cited by examiner

Primary Examiner—Robert A. Rose
(74) Attorney, Agent, or Firm—Wenderoth, Lind & Ponack, L.L.P.

(57) ABSTRACT

The present invention relates to a polishing apparatus for polishing a workpiece, such as a semiconductor wafer, to a flat mirror finish. The polishing apparatus comprises a polishing table having a polishing surface, and a top ring, and the workpiece is interposed between the polishing table and the top ring, and pressed at a predetermined pressure to polish the workpiece. The polishing apparatus comprises at least two dressing units for dressing the polishing surface by being brought into contact with the ppolishing surface, which is a surface of a polishing cloth.

18 Claims, 19 Drawing Sheets

POLISHING APPARATUS

TECHNICAL FIELD

The present invention relates to a polishing apparatus for polishing a workpiece, such as a semiconductor wafer, to a flat mirror finish, and more particularly to a polishing apparatus comprising a dresser for dressing a surface of a polishing cloth attached to an upper surface of a polishing table.

BACKGROUND ART

As semiconductor devices have become more highly integrated in recent years, circuit interconnections have become finer and a distance between these circuit interconnections have become smaller. In case of photolithography which can form interconnections that are at most 0.5 μm wide, it is required that surfaces on which pattern images are to be focused by a stepper should be as flat as possible because a depth of focus of an optical system is relatively small. A polishing apparatus for performing chemical mechanical polishing (CMP) has been used for planarizing a semiconductor wafer.

In a polishing apparatus for polishing and planarizing a surface of a semiconductor wafer on which a device pattern is formed, a non-woven fabric has heretofore been used as a polishing cloth attached to an upper surface of a polishing table. However, as ICs and LSIs have become more highly integrated in recent years, it is required to reduce differences in levels of a surface, to be polished, of the a device pattern during polishing. In order to meet a demand for polishing so as to reduce differences in levels of a surface, to be polished, of a device pattern, a polishing cloth made of a hard material, e.g., a polishing cloth of foam polyurethane, has been used.

This type of polishing apparatus comprises, as shown in FIG. 21, a polishing table 402 having a polishing cloth (polishing pad) 400 attached thereon and constituting a polishing surface, and a top ring 404 for holding a substrate W as a workpiece to be polished, such as a semiconductor wafer, in such a manner that a surface to be polished faces the polishing cloth 400. A semiconductor wafer W is polished by this polishing apparatus as follows: The polishing table 402 and the top ring 404 are independently rotated, and, while a polishing liquid is supplied from a polishing liquid nozzle 406 provided above the polishing table 402, the semiconductor wafer W is pressed against the polishing cloth 400 on the polishing table 402 at a predetermined pressure by the top ring 404. For example, a suspension of fine polishing particles of silica or the like in an alkali solution is used as the polishing liquid supplied from the polishing liquid nozzle 406. Thus, the semiconductor wafer W is polished to a flat mirror finish by a combined effect of a chemical polishing effect attained by the alkali and a mechanical polishing effect attained by the polishing particles.

When the semiconductor wafer W is brought into contact with the polishing cloth 400 and the polishing table 402 is rotated to perform polishing, polishing particles or polishing wastes are attached to the polishing cloth 400, resulting in a change in properties of the polishing cloth 400 and a deterioration in polishing performance. Therefore, if an identical polishing cloth 400 is repeatedly used for polishing semiconductor wafers W, problems such as lowered polishing rate and uneven polishing are caused. In order to overcome such problems, conditioning called dressing is performed before, after or during polishing of a semiconductor wafer to regenerate a polishing cloth.

When dressing of a polishing cloth is performed, a dresser 408 is provided in the polishing apparatus, and polishing cloth 400 is dressed by the dresser 408 at a time of replacement of a semiconductor wafer W to be polished, for example. Specifically, while a dressing element attached to a lower surface of the dresser 408 is pressed against the polishing cloth 400 on the polishing table 402, the polishing table 402 and the dresser 408 are independently rotated to remove polishing particles and polishing wastes attached to a polishing surface of the polishing cloth and to flatten and dress the polishing surface in its entirety, whereby the polishing surface is regenerated.

With respect to dressing of a polishing cloth, in accordance with properties of the polishing cloth, the conventional polishing apparatus comprises one dresser selected from the group including a contact-type diamond dresser having diamond particles, a contact-type brush dresser having a brush, and a non-contact-type dresser for ejecting a fluid jet toward a surface of the polishing cloth to perform dressing.

However, during dressing of a polishing cloth, it has become necessary to use different dressers, for example, a dresser for thinly shaving a surface of the polishing cloth for initial surface conditioning before use during polishing, and a dresser for removing clogged aggregation of slurry (polishing liquid) and polishing wastes from the polishing cloth during a polishing process. If the clogged aggregation of the slurry (polishing liquid) or the polishing wastes are not removed from the polishing cloth, there is a high possibility that polishing particles and polishing wastes become attached to the polishing cloth to deteriorate a polishing function, or a surface, to be polished, of a semiconductor wafer is scratched, resulting in lowered yield. Therefore, in the conventional polishing apparatus, two or more dressers having different dressing elements should be replaced as needed. This work is troublesome and disadvantageously lowers throughput of polished semiconductor wafers.

Further, in the conventional polishing apparatus, if the top ring unit and the dressing unit are provided adjacent to each other for reasons of restriction of a layout, or if a plurality of top ring units and a dressing unit are arranged on a single table so as to interfere with each other, then dressing can be performed only when the top ring does not perform polishing and is positioned at a stand-by position. As a result, polishing cannot be performed during dressing, and hence a number of semiconductor wafers to be polished per unit time is decreased.

A thickness of a thin film formed on a surface of a semiconductor wafer varies from position to position in a radial direction of the semiconductor wafer depending on a film deposition method or characteristics of a film deposition apparatus. Specifically, the thin film has a film thickness distribution in the radial direction. Further, the film thickness distribution varies depending on a type of film deposition method performed or film deposition apparatus used. Specifically, a position and number of portions having a large film thickness in the radial direction, and difference in thickness between thin film portions and thick film portions, vary depending on the type of film deposition method performed or a film deposition apparatus used.

However, with the aforementioned conventional dresser, an entire polishing surface is uniformly dressed, so that the entire polishing surface is regenerated to a uniform condition, whereby the entire polishing surface has uniform polishing performance. Therefore, if an entire area of a semiconductor wafer is uniformly pressed against the polishing surface after the polishing surface is regenerated by the conventional dresser, then a polishing rate is identical over the entire area of the semiconductor wafer. Thus, it is impossible to perform polishing in accordance with the above film thickness distribution, and hence a semiconductor substrate is excessively polished at portions having a small film thickness and is insufficiently polished at portions having a large film thickness.

SUMMARY OF INVENTION

The present invention has been made in view of the above drawbacks. It is therefore a first object of the present invention to provide a polishing apparatus comprising a dressing unit which can maintain good polishing performance of a polishing cloth used for polishing a semiconductor wafer, and thus can enhance the yield and productivity of polished semiconductor wafers, and to provide a dressing method for dressing the polishing cloth of the polishing apparatus.

In order to attain the first object, according to one aspect of the present invention, there is provided a polishing apparatus with a polishing table having a,polishing surface and a top ring for pressing a workpiece at a predetermined pressure while interposing the workpiece between the polishing table and the top ring to polish the workpiece, wherein the polishing apparatus includes at least two dressing units for dressing the polishing surface by being brought into contact with a surface of the polishing surface.

According to a preferred aspect of the present invention, dressers in the at least two dressing units comprise different dressing elements, respectively.

According to another preferred aspect of the present invention, at least one dressing unit is a dressing unit comprises a dresser having a diameter larger than that of a workpiece to be polished; and at least one dressing unit is a dressing unit comprises a dresser having a diameter smaller than that of the workpiece to be polished.

According to a further preferred aspect of the present invention, the dressing unit comprising the dresser having a diameter smaller than that of the workpiece to be polished is swung during dressing.

According to another aspect of the present invention, there is provided a dressing method for dressing a polishing cloth provided in a polishing apparatus. The dressingmethod includes: initially conditioning the polishing cloth, before use for polishing, by a dressing unit comprising a diamond dresser or an SiC dresser; and conditioning the polishing cloth between processes of polishing a workpiece, by a dressing unit comprising a brush dresser.

According to still another aspect of the present invention, there is provided a dressing method for dressing a polishing cloth provided in a polishing apparatus. This dressing method includes: initially conditioning the polishing cloth, before use for polishing, by a dressing unit comprising a diamond dresser or an SiC dresser; and between processes of polishing a workpiece, firstly conditioning the polishing cloth by a dressing unit comprising a diamond dresser or an SiC dresser, and then conditioning the polishing cloth by a dressing unit comprising a brush dresser.

According to a further aspect of the present invention, there is provided a dressing method for dressing a polishing surface during polishing of a workpiece in a polishing apparatus. This dressing method includes: dressing the polishing surface while swinging a dressing unit comprising a dresser having a diameter smaller than a workpiece to be polished; and after a top ring is withdrawn, dressing the polishing surface with a dressing unit comprising a dresser having a diameter larger than the workpiece to be polished.

According to the present invention, there is no need to replace a contact-type diamond dresser having diamond particles and a contact-type brush dresser having a brush with each other, and a polishing cloth can be dressed using a suitable combination of dressers.

It is a second object of the present invention to provide a polishing apparatus which can perform polishing in accordance with a thickness distribution of a thin film formed on a surface of a workpiece to be polished, such as a semiconductor wafer, and thus can obtain uniformity of film thickness after polishing the workpiece.

In order to attain the second object of the present invention, there is provided a polishing apparatus with a polishing table having a polishing surface and a top ring for pressing a workpiece against the polishing surface of the polishing table to polish the workpiece, wherein the polishing apparatus includes a dresser for dressing the polishing surface of the polishing table. The dresser dressing dresses an area of the polishing surface used for polishing a predetermined position of a surface, of the workpiece in accordance with a film thickness to be polished in at the predetermined position of the surface of the workpiece.

According to another aspect of the present invention, there is provided a polishing apparatus comprising: at least one of a moving mechanism for moving a dresser on a polishing surface of a polishing table, a rotating mechanism for rotating a dresser, and a pressing mechanism for pressing a dresser against a polishing surface of a polishing table; and a controller for controlling at least one of a speed of movement of the dresser caused by the moving mechanism, a rotational speed of the dresser caused by the rotating mechanism, and a pressing load of the dresser caused by the pressing mechanism, within an area of the polishing surface used for polishing a predetermined position of a surface, of a workpiece in accordance with a film thickness to be polished at the predetermined position of the surface of the workpiece.

According to the present invention, an area to be dressed can be varied as desired within a polishing surface. Therefore, a polishing cloth used for polishing an area in which a film thickness to be polished is large is dressed more than a polishing cloth used for polishing an area in which a film thickness to be polished is small. Thus, an area in which a film thickness to be polished is large can be polished relatively more, and an area in which a film thickness to be polished is small can be polished relatively less. Consequently, polishing can be properly performed in accordance with the a profile (film thickness distribution) of a surface, to be polished, of a workpiece.

According to one preferred aspect of the present invention, a dresser has a diameter smaller than that of a workpiece to be polished. Further, the dresser dresses a polishing surface during polishing. Furthermore, a polishing apparatus further comprises a cleaning bath for cleaning the dresser.

According to another preferred aspect of the present invention, the polishing apparatus further comprises a film thickness measuring unit for measuring a film thickness of a surface, to be polished, of a workpiece. With this arrangement, an actual profile of the surface, to be polished, of the workpiece can be obtained by measurement with the film thickness measuring unit, and hence polishing can be performed more properly in accordance with the actual profile of each of the workpieces.

According to a further aspect of the present invention, the polishing apparatus further comprises a second dresser for dressing substantially an entire area of a polishing surface against which a workpiece to be polished is pressed. Preferably, the second dresser has a diameter larger than that of the workpiece to be polished, and the second dresser dresses substantially the entire area of the polishing surface against which the workpiece to be polished is pressed. With this arrangement, protrusions on the polishing surface can selectively be removed to flatten the polishing surface. Specifically, since portions of the polishing surface which have been dressed more during polishing are worn earlier than other portions, irregularities are generated on a polished surface after a polishing operation. However, dressing by the second dresser can remove only protrusions of the irregularities to flatten the polishing surface.

Further, according to another aspect of the present invention, when a polishing surface has been locally worn, the second dresser dresses substantially an entire area of the polishing surface. With this arrangement, for example, even when the polishing surface has been locally worn due to dressing of another dresser, a state of the polishing surface can be reset by the second dresser, for thereby performing the subsequent polishing with higher accuracy.

According to a still further aspect of the present invention, there is provided a polishing apparatus with a polishing table having a polishing surface and a top ring for pressing a workpiece against the polishing surface of the polishing table to polish the workpiece, wherein the polishing apparatus comprises: a dressing unit integrally having a first dresser for dressing the polishing surface of the polishing table during polishing of the workpiece; and a second dresser for dressing the polishing surface of the polishing table when the workpiece is not being polished. With this arrangement, two dressers having different purposes can be integrated, for thereby reducing necessary space for the apparatus.

BRIEF DESCRIPTION OF DRAWINGS

FIGS. 3A to 3C are diagrams showing a detailed structure of a dresser in a dressing unit having a diamond dresser, wherein FIG. 3A is a bottom view, FIG. 3B is a cross-sectional view taken along line a—a of FIG. 3A, and FIG. 3C is an enlarged view of portion b in FIG. 3B;

FIGS. 4A and 4B are diagrams showing a detailed structure of a dresser in a dressing unit having a brush dresser, wherein FIG. 4A is a bottom view, and FIG. 4B is a cross-sectional view taken along line b—b of FIG. 4A;

DETAILED DESCRIPTION OF THE PREFERRED EMBODIMENTS

Figure 1:
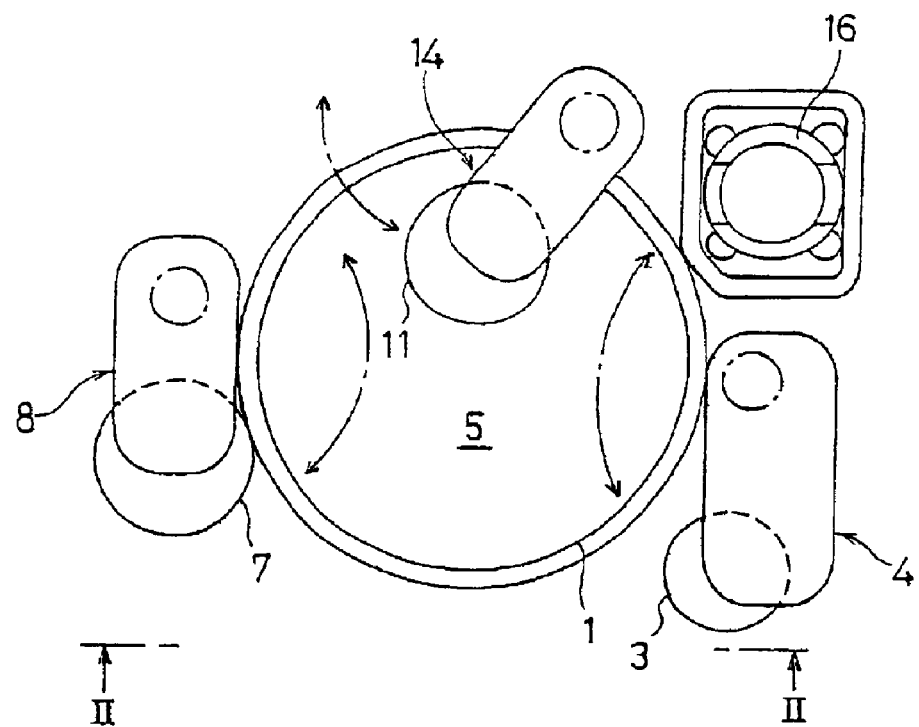
FIG. 1 is a plan view showing an entire structure of a polishing apparatus according to a first embodiment of the present invention.
Figure 2:
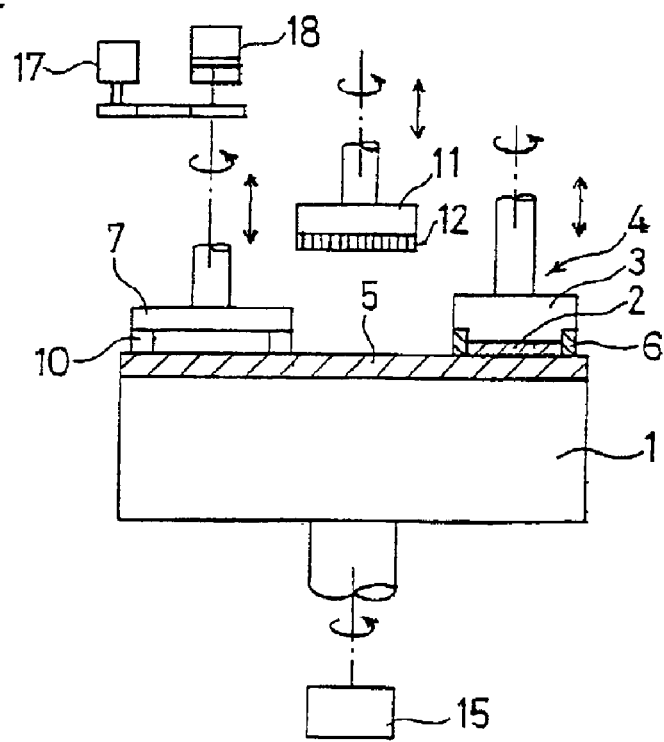
FIG. 2 is a cross-sectional view taken along line II—II of FIG. 1.

A polishing apparatus according to s a first embodiment of the present invention will be described below with reference to FIGS. 1 through 5B. FIGS. 1 and 2 show an entire structure of the polishing apparatus according to the present invention, wherein FIG. 1 is a plan view, and FIG. 2 is a cross-sectional view taken along line II—II of FIG. 1. As shown in FIGS. 1 and 2, the polishing apparatus comprises a polishing table 1 and a top ring unit 4 having a top ring 3 for pressing a semiconductor wafer 2 against the polishing table 1 while holding the semiconductor wafer 2. The polishing table 1 is coupled to a motor 15 and is rotatable about a shaft of the motor 15, as indicated by an arrow. A polishing cloth 5 is attached to an upper surface of the polishing table 1.

The top ring unit 4 is horizontally swingable so that the top ring 3 can be positioned at a delivery position above a pusher 16 for delivering a semiconductor wafer 2, a polishing position on the polishing table 1, and a standby or refuge position. The top ring 3 is coupled to a motor (not shown) and is connected to an elevator cylinder (not shown). Therefore, the top ring 3 is vertically movable and is rotatable about a shaft of the motor, as indicated by arrows, and can press the semiconductor wafer 2 against the polishing cloth 5 under a desired pressure. The semiconductor wafer 2 is attracted to a lower end surface of the top ring 3 by vacuum suction or the like. A guide ring 6 for preventing the semiconductor wafer 2 from being removed from the top ring 3 is provided on a lower peripheral portion of the top ring 3. Further, a polishing liquid supply nozzle (not shown) is provided above the polishing table 1, and a polishing liquid is supplied onto the polishing cloth 5 on the polishing table 1 from the polishing liquid supply nozzle.

The polishing apparatus comprises a dressing unit 8 having a diamond dresser 7, and a dressing unit 14 having a brush dresser 11. Both of the dressing unit 8 and the dressing unit 14 are horizontally swingable so that the dressers 7, 11 can respectively be positioned at a dressing position on the polishing table 1 and at a standby or refuge position. The dresser 7 is coupled to a motor 17 for rotation and is connected to an elevator cylinder 18. Therefore, the dresser 7 is vertically movable and is rotatable about a shaft of the motor 17, as indicated by arrows. The dresser 11 is also vertically movable and is rotatable about a shaft by the same mechanism as in is the dresser 7.

Figure 3A:
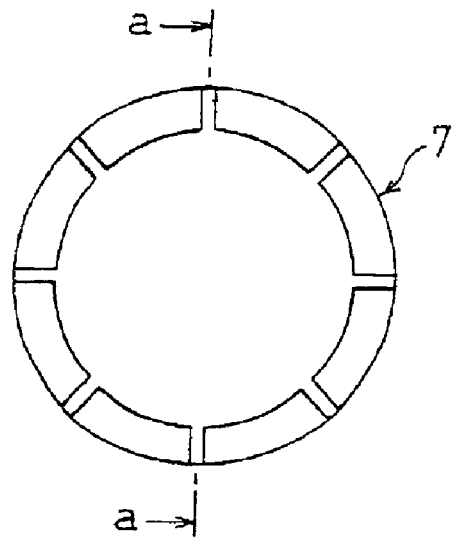
Figure 3B:
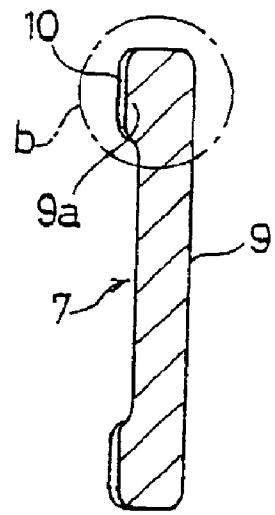
Figure 3C:
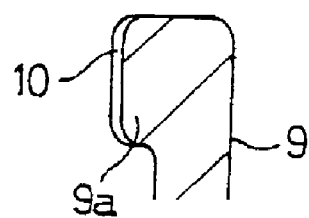

FIGS. 3A through 3C show a detailed structure of the diamond dresser in the dressing unit 8, wherein FIG. 3A is a bottom view, FIG. 3B is a cross-sectional view taken along a line a—a of FIG. 3A, and FIG. 3C is an enlarged view of a portion b in FIG. 3B.

As shown in FIGS. 3A through 3C, the diamond dresser 7 is in a disk form and comprises a dresser body 9 provided on a peripheral portion of a lower surface thereof, and the dresser body 9 has band-shaped protrusions 9a having a predetermined circumferential width for electrodepositing fine particles of diamond. A diamond electrodeposition ring 10 formed by electrodepositing fine particles of diamond is provided on surfaces of the protrusions 9a. While the polishing table 1 and the dresser 7 are rotated and, a dressing liquid such as pure water and, if necessary, a polishing liquid are supplied from a nozzle (not shown) to a central portion of rotating polishing cloth 5, a surface of the diamond electrodeposition ring 10 is brought into contact with a surface of the polishing cloth to thinly shave the surface of the polishing cloth for dressing. The diamond electrodeposition ring 10 has a structure such that fine particles of diamond are deposited on the surfaces of the protrusions 9a, and portions on which diamond is deposited are plated with nickel, and hence fine particles of diamond are bonded to the surfaces of the protrusions 9a by nickel plating.

With respect to dimensions of this dresser, for example, a diameter of the dresser body 9 is 250 mm, and a plurality of sectoral members (8 members in FIG. 3A) having diamond electrodeposited thereon and a width of 8 mm are arranged on the peripheral portion of the lower surface of the dresser body to form a ring. The diameter of the dresser body is larger than a diameter (200 mm) of a semiconductor wafer as a workpiece to be polished, and the dresser body has a margin on an internal circumferential side and an outer circumferential side in the a radial direction of the table so that a dressed area of the polishing cloth is larger than an area of a polishing surface that is to be used for polishing the semiconductor wafer. An SiC dresser using a ring comprising a plurality of SiC sectors may be used instead of the diamond dresser having a diamond electrodeposition ring. In this case, the SiC dresser has the same structure as the dresser shown in FIGS. 3A through 3C, and has a number of pyramid-shaped projections disposed on a surface thereof of several tens of μm.

Figure 4A:
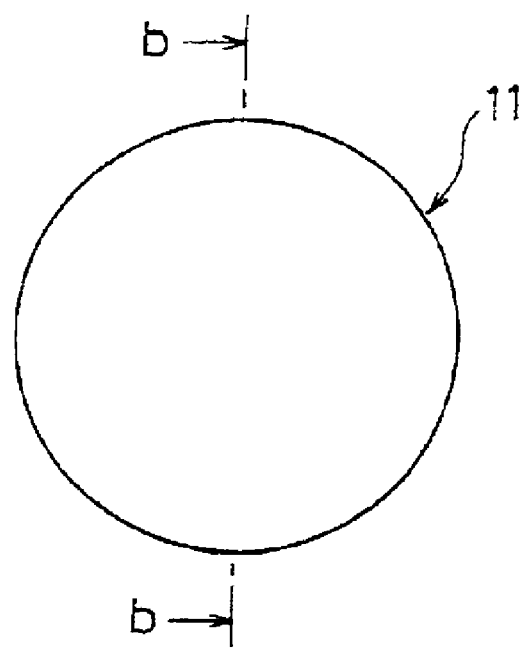
Figure 4B:
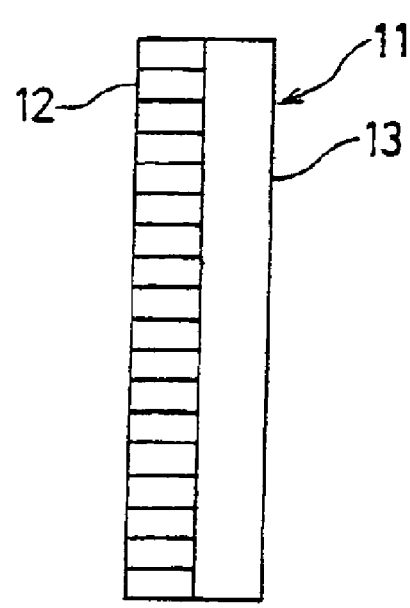

FIGS. 4A and 4B show a detailed structure of the brush dresser in dressing unit 14, wherein FIG. 4A is a bottom view, and FIG. 4B is a cross-sectional view taken along line b—b of FIG. 4A. The brush dresser 11 is in a disk form and comprises a dresser body 13 having a brush 12 on an entire area of a lower surface thereof. While the polishing table 1 and the dresser 11 are rotated and, a dressing liquid such as pure water and, if necessary, a polishing liquid are supplied from a nozzle (not shown) to a central portion of rotating polishing cloth 5, a surface of the brush is brought into contact with a surface of the polishing cloth for dressing to remove aggregation of slurry (polishing liquid) and polishing wastes from the polishing cloth.

With respect to dimensions of this dresser, for example, a diameter of the dresser body is 238 mm, and the dresser body comprises a nylon brush having a length of 7 mm, on an entire area of the lower surface thereof.

The diameter of the dresser body is larger than a diameter (200 mm) of a semiconductor wafer as a workpiece to be polished, and the dresser body has a margin on an internal circumferential side and an outer circumferential side in a radial direction of the table so that a dressed area of the polishing cloth is larger than an area of the polishing surface that is to be used for polishing the semiconductor wafer.

Figure 5A:
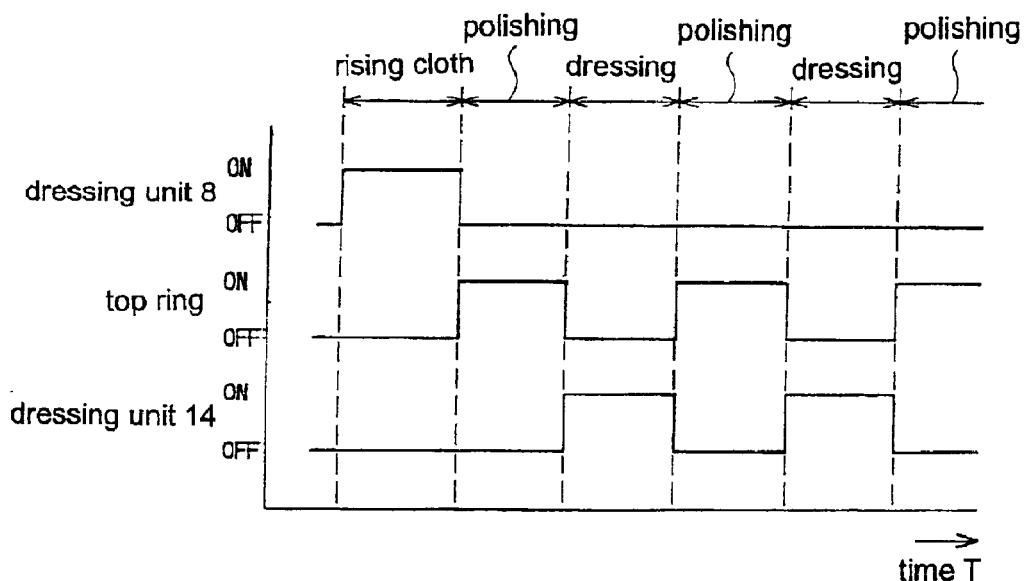
FIGS. 5A and 5B are timing charts showing a series of processes of polishing and dressing using the polishing apparatus shown in FIG. 1.
Figure 5B:
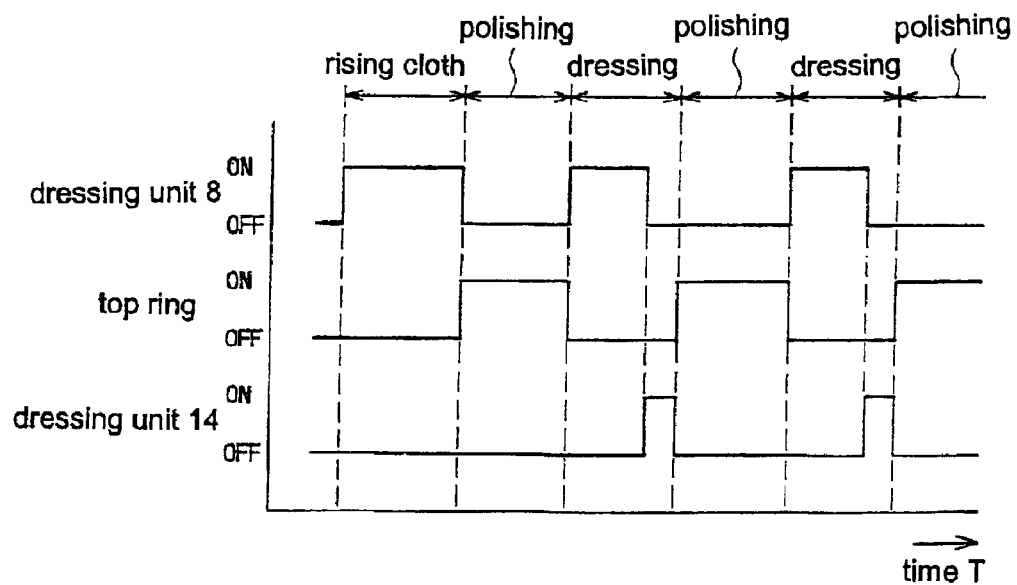

FIGS. 5A and 5B are diagrams showing relationships of operation in time series with respect to a series of processes of polishing and dressing using the polishing apparatus having a construction shown in FIG. 1 for processing semiconductor wafers.

In an example shown in FIG. 5A, a surface of a polishing cloth is thinly shaved by the dressing unit 8 having the diamond dresser 7 (see FIG. 1) for performing initial surface conditioning of the polishing cloth before use for polishing, and then the semiconductor wafer 2 is polished by the top ring 3 (see FIG. 2). In a period between polishing processes, dressing is performed by the dressing unit 14 having the brush dresser 11 (see FIG. 1).

In an example shown in FIG. 5B, a surface of a polishing cloth is thinly shaved by the dressing unit 8 having the diamond dresser 7 for performing initial surface conditioning of the polishing cloth before use for polishing, and then semiconductor wafer 2 is polished by the top ring 3. In a period between polishing processes, two-stage dressing is performed. Specifically, dressing is first performed by the dressing unit 8 having the diamond dresser 7, and subsequent dressing is performed by the dressing unit 14 having the brush dresser 11.

As shown in FIGS. 5A and 5B, according to the polishing apparatus of the present invention, the surface of the polishing cloth is thinly shaved by the dressing unit 8 having the diamond dresser 7 for performing initial surface conditioning of the polishing cloth before use for polishing, and then the semiconductor wafer 2 is polished by the top ring 3 (see FIG. 2). In a period between polishing processes, dressing by the dressing unit 8 having the diamond dresser 7 and dressing by the dressing unit 14 having the brush dresser 11 may properly be combined.

According to the present embodiment, a contact-type diamond dresser having diamond particles and a contact-type brush dresser having a brush have been described as dressers for the dressing units 8 and 14. Further, the dressers may be ones selected from the group including the above dressers and a non-contact-type dresser for ejecting a fluid jet toward a surface of a polishing cloth to dress the polishing cloth. Furthermore, three dressing units or dressers may be provided in the polishing apparatus. In the present embodiment, pure water is applied as a dressing liquid used in each of the dressing units. In order to attain a chemical dressing effect in addition to mechanical dressing effect, a chemical liquid such as an acid, an alkali, or a surface active agent may also be used. A polishing surface of the polishing table 1 may be constituted by a polishing cloth or a grinding stone.

As described above, according to the first embodiment of the present invention, a contact-type dresser having diamond particles and a contact-type dresser having a brush are provided as dressers used for dressing a surface of a polishing cloth, i.e., at least two dressing units are provided. This can eliminate a need to replace one dresser with another dresser, and at least two selected dressers can properly be combined so as to perform the optimum dressing of a polishing cloth.

Next, a polishing apparatus according to a second embodiment of the present invention will be described below with reference to FIGS. 6 to 8.

Figure 6:
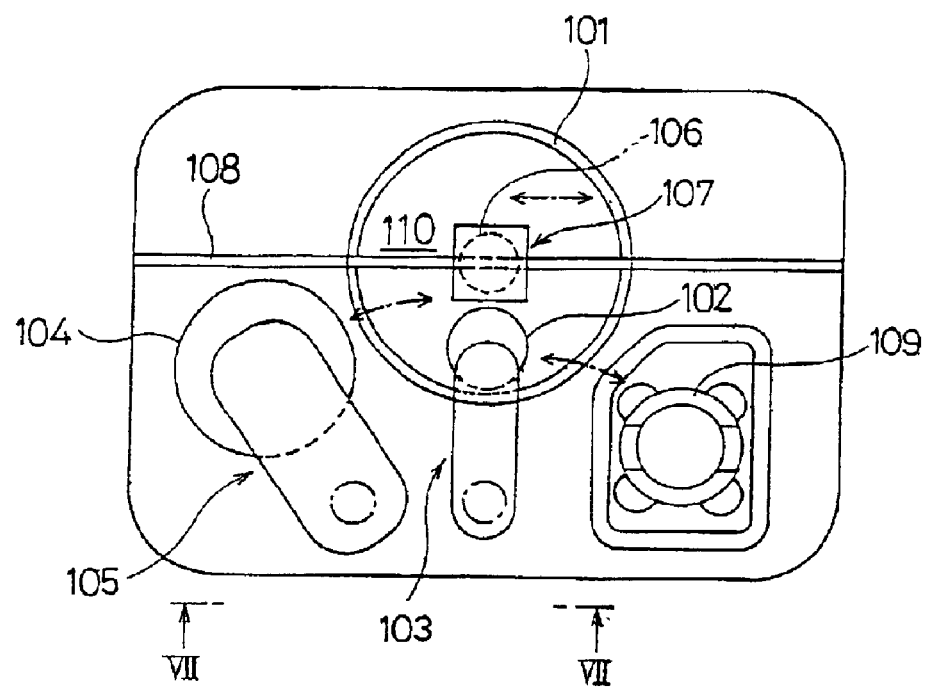
FIG. 6 is a plan view showing an entire construction of a polishing apparatus according to a second embodiment of the present invention.
Figure 7:
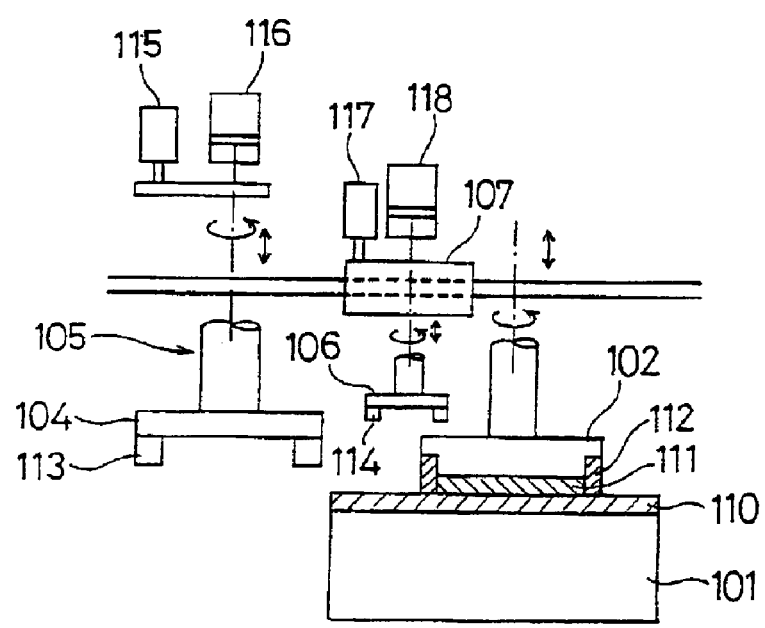
FIG. 7 is a cross-sectional view taken along line VII—VII of FIG. 6.

FIGS. 6 and 7 are diagrams showing a polishing apparatus according to the second embodiment of the present invention, wherein FIG. 6 is a plan view, and FIG. 7 is a cross-sectional view taken along line VII—VII of FIG. 6. In FIGS. 6 and 7, the reference numeral 101 denotes a polishing table, reference numeral 103 denotes a top ring unit with a top ring 102, reference numeral 105 denotes a dressing unit with a dresser 104 having a diameter larger than that of a semiconductor wafer 111 as a workpiece to be polished, and the reference numeral 107 denotes a dressing unit with a dresser 106 having a diameter smaller than that of the semiconductor wafer 111 as the workpiece to be polished. The dresser 106 can be reciprocated along a guide rail 108. A pusher 109 for delivering a semiconductor wafer to the top ring 102 is provided adjacent to the polishing table 101. Here, the dresser 104 cannot perform a dressing operation during a polishing process of the semiconductor wafer 111 by the top ring 102, and the dresser 106 can perform a dressing operation during a polishing process of the semiconductor wafer 111 by the top ring 102. Specifically, an operation range of the dresser 106 does not interfere with an operation range of the top ring 102. A polishing surface of the polishing table 101 may be constituted by a polishing cloth or a grinding stone.

In FIGS. 6 and 7, the dressing unit 105 is rotatable so that the dresser 104 can be positioned at a dressing position on the polishing table 101 and a stand-by position. The dresser 104 is coupled to a motor 115 for rotation and is connected to an elevator cylinder 116. Therefore, the dresser 104 is vertically movable and is rotatable about a shaft of the motor 115, as indicated by arrows. The top ring 102 is coupled to a motor (not shown) for rotation and is connected to an elevator cylinder (not shown). Therefore, the top ring 102 is vertically movable and is rotatable about a shaft of its motor, as indicated by arrows. Thus, the top ring 102 can press semiconductor wafer 111 against the polishing table 101 at a desired pressure. Semiconductor wafer 111 as a workpiece to be polished is attracted to a lower end surface of the top ring 102 by vacuum suction or the like. A guide ring 112 for preventing the semiconductor wafer 111 from being removed from the top ring 102 is provided on a lower peripheral portion of the top ring 102. Further, a polishing liquid supply nozzle (not shown) is provided above the polishing table 101, and a polishing liquid is supplied onto a polishing cloth 110 on the polishing table 101 from the polishing liquid supply nozzle. In FIG. 7, the reference numerals 113 and 114 respectively denotes diamond electrodeposition rings. That is, both of the dressers 104 and 106 are constituted by a diamond dresser. However, a brush dresser may be used for the dressers 104, 106.

The dressing unit 107 can be reciprocated along the guide rail 108 so as to horizontally slide along the polishing table 101 and to dress a polishing surface for a semiconductor wafer while sliding on a surface of the polishing table. The dresser 106 is coupled to a motor 117 for rotation and is connected to an elevator cylinder 118. Therefore, the dresser 106 is vertically movable and is rotatable about a shaft of the motor 117, as indicated by arrows.

Figure 8:
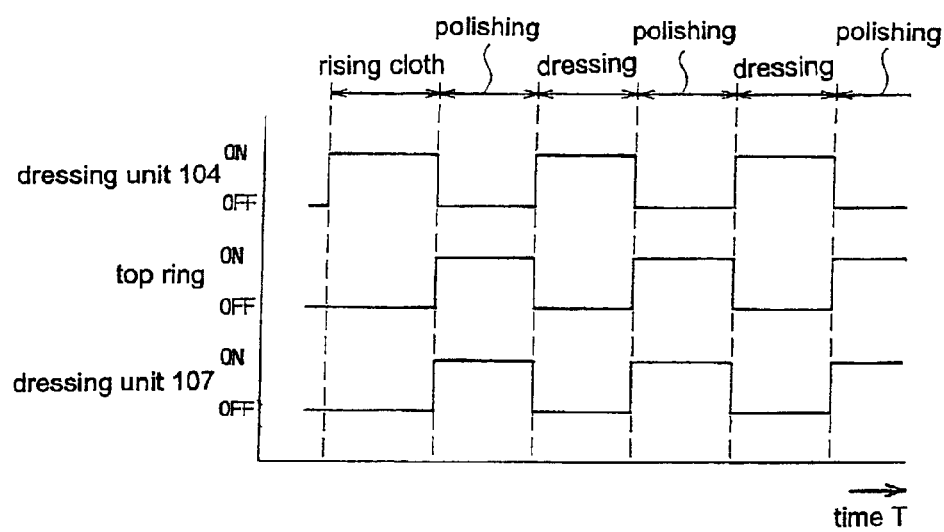
FIG. 8 is a timing chart showing a series of processes of polishing and dressing using the polishing apparatus shown in FIG. 6.

FIG. 8 is a diagram showing a relationship of operation in time series with respect to a series of processes of polishing and dressing using the polishing apparatus having a construction shown in FIG. 6 for processing semiconductor wafers. The dressing unit 105 comprising a diamond dresser 104 having diamond particles and a diameter larger than a workpiece to be polished is used for performing initial surface conditioning of the polishing cloth 110 before use for polishing. After completion of the initial surface conditioning of the polishing cloth, the top ring 102 receives a semiconductor wafer from the pusher (a device for delivering a wafer) 109, and is moved to a polishing position on the polishing table 101. Dressing during polishing of semiconductor wafer 111 is performed by the dressing unit 107 comprising a diamond dresser 106 having diamond particles and a diameter smaller than the semiconductor wafer while sliding the dressing unit 107, because the polishing table 101 is small. After the completion of the polishing, the top ring 102 is swung above the pusher 109, and the polishing cloth 110 is then dressed by the dressing unit 105 comprising a diamond dresser 104 having diamond particles and a diameter larger than the polished semiconductor wafer. A time for dressing by the dressing unit 107 during polishing of semiconductor wafer 111 may be selected as desired.

Figure 9:
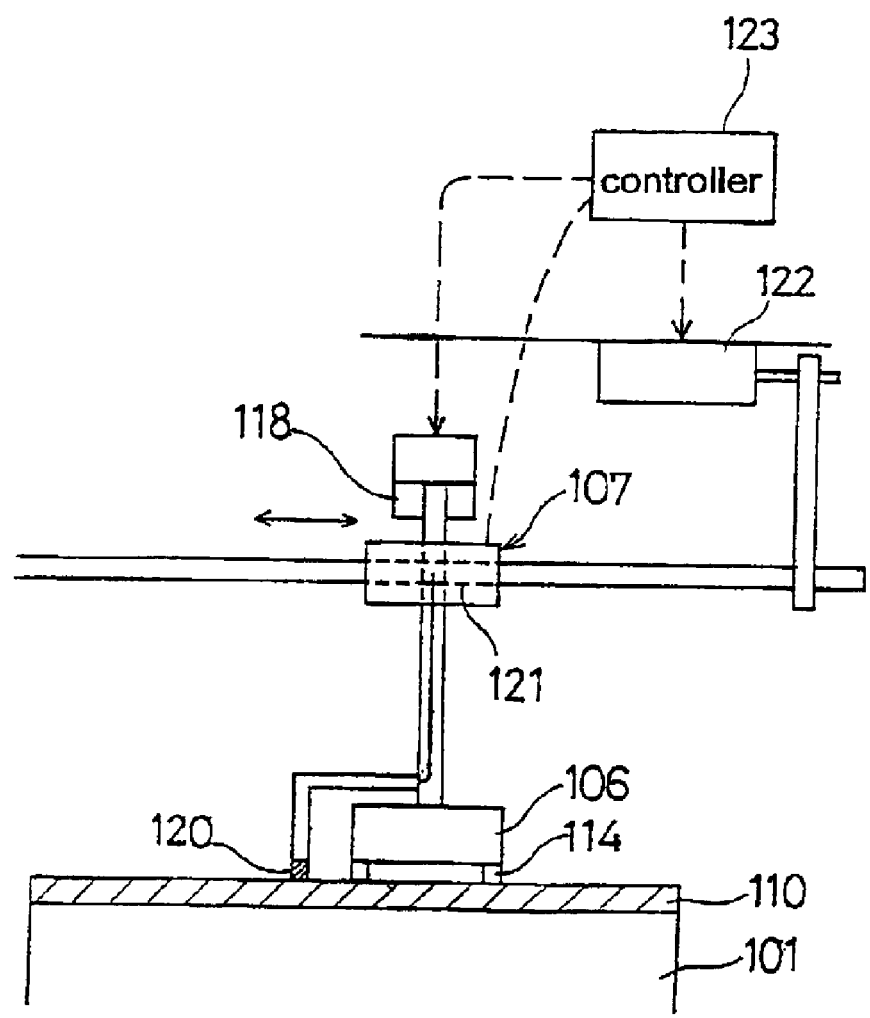
FIG. 9 is a front view showing a variant of the embodiment shown in FIGS. 6 and 7, in which large and small dressers are provided.

FIG. 9 is a front view showing a variant of the embodiment shown in FIGS. 6 and 7, in which large and small dressers are provided. In FIG. 9, only a small-diameter diamond dresser 106 is shown with omission of a large-diameter dresser. As shown in FIG. 9, a contact sensor 120 is provided at a front end of the small-diameter dresser 106, which can pass through a center of polishing table 101 and be moved in a diametric direction of the polishing table. A profile (surface waviness) of polishing cloth 110, which is defined as unevenness in a radial direction of a polishing surface (upper surface of the polishing cloth 110), can be measured with the contact sensor 120 while reciprocating the small-diameter dresser 106 along a diameter of the polishing table 101. The polishing cloth 110 can locally be dressed by the small-diameter diamond dresser 106 so as to correct measured unevenness on the polishing cloth in a radial direction of the polishing table. After the polishing surface is flattened by the small-diameter diamond dresser 106, a large-diameter dresser using a brush instead of the diamond electrodeposition ring 113 shown in FIG. 7 is used to remove polishing wastes and remaining polishing particles from the polishing surface. Alternatively, the large-diameter dresser may be constituted by the diamond dresser as shown in FIG. 7 for flattening the polishing surface, and the small-diameter dresser may be constituted by a brush dresser for removing polishing wastes and remaining polishing particles from the polishing surface. The polishing surface of the polishing table 101 may be a polishing cloth or a grinding stone.

FIG. 9 shows a mechanism for reciprocating the dressing unit 107. Specifically, the dressing unit 107 is constructed so that the dressing unit 107 is reciprocated by rotating a ball screw 121 normally or reversely by a motor 122 for a dresser slider. Reference numeral 123 denotes a controller for controlling reciprocation of the dressing unit 107 and simultaneously controlling a pressing force of the dresser 106.

As described above, according to the second embodiment of the present invention, at least one dresser having a diameter smaller than that of a workpiece to be polished, and at least one dresser having a diameter larger than that of the workpiece to be polished, are provided. Thus, dressing can be performed by the small-diameter dresser during polishing to increase a number of semiconductor wafers to be polished per unit time. Therefore, the application of the present invention to the production of semiconductor devices can contribute to good production yield and improved productivity. When one additional small-diameter dresser is provided, a necessary number of large-diameter dressers can be decreased to reduce necessary space for the apparatus.

Next, a polishing apparatus according to a third embodiment of the present invention will be described below with reference to FIGS. 10 through 17.

Figure 10:
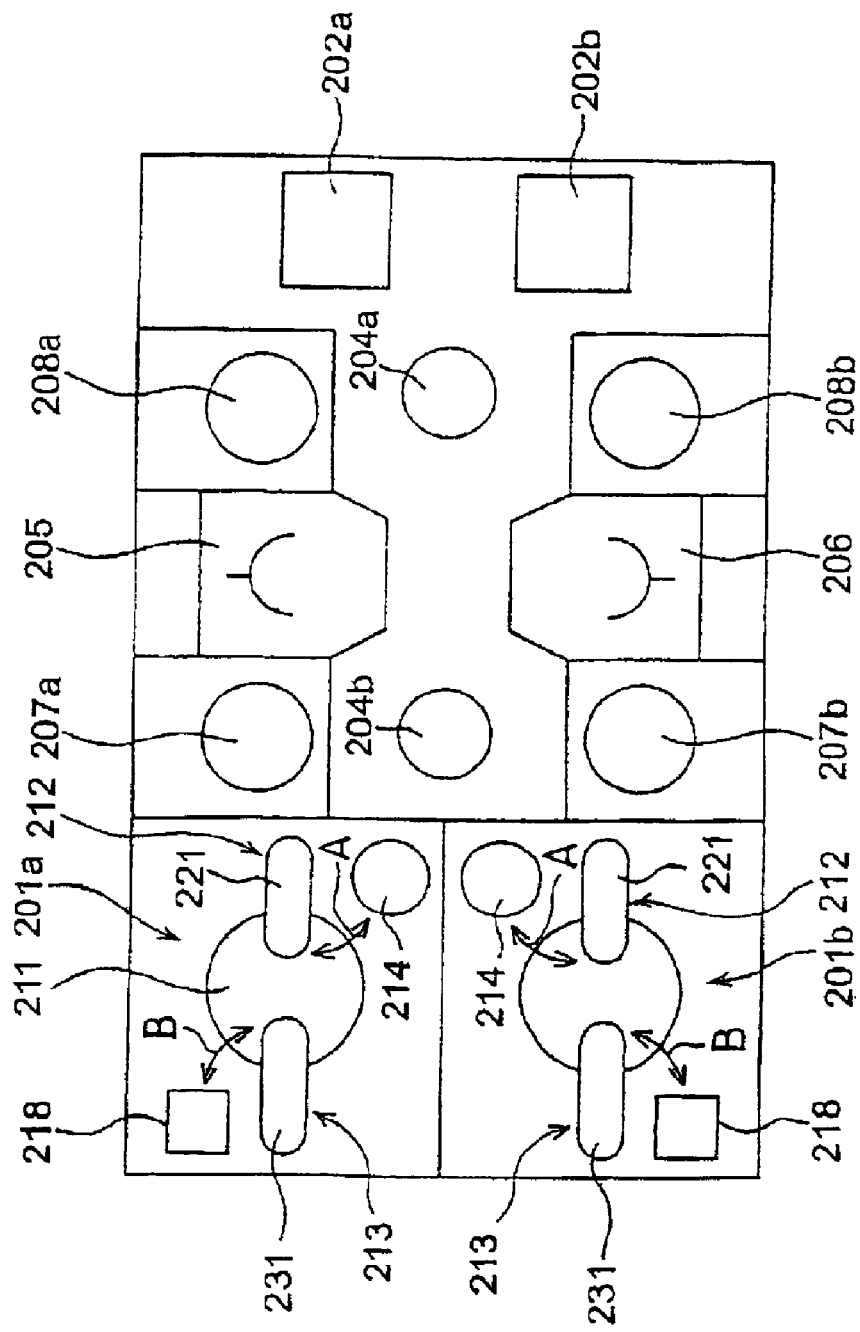
FIG. 10 is a schematic plan view showing a polishing apparatus according to a third embodiment of the present invention.

FIG. 10 is a schematic plan view showing the polishing apparatus according to the present embodiment.

As shown in FIG. 10, in the polishing apparatus according to the present embodiment, a pair of polishing sections 201a, 201b are disposed on one side of a space on a floor, which is rectangular as a whole, so as to laterally face each other. A pair of load/unload units for placing thereon cassettes 202a, 202b for accommodating semiconductor wafers are disposed on another side of the space. Two transfer robots 204a, 204b for transferring a semiconductor wafer are disposed on a line connecting the polishing sections 201a, 201b to the load/unload units to constitute a transfer line. One inverter 205 or 206 is disposed on each side of the transfer line, respectively, and two cleaning units 207a and 208a, or 207b and 208b are disposed with the inverter 205 or 206 interposed therebetween.

In the two polishing sections 201a, 201b, apparatuses basically having the same specifications are disposed symmetrically with respect to the transfer line. Each of the apparatuses comprises a polishing table 211 having a polishing cloth attached to an upper surface thereof, a top ring unit 212 for holding a semiconductor wafer, as a workpiece to be polished, by vacuum suction and pressing the semiconductor wafer against the polishing table 211 to polish the semiconductor wafer, a dressing unit 213 for dressing the polishing cloth on the polishing table 211. A pusher 214 for receiving a semiconductor wafer from the top ring unit 212 and transferring the semiconductor wafer to the top ring unit 212 is provided at a transfer line side in each of the polishing sections 201a, 201b.

The transfer robots 204a, 204b have an articulated arm which is bendable and extendable within a horizontal plane and has upper and lower holding portions which are separately used respectively as a dry finger and a wet finger. Since two robots are used in the present embodiment, a first robot 204a is basically responsible for a region from the inverters 205, 206 to the cassettes 202a, 202b, and a second robot 204b is basically responsible for a region from the inverters 205, 206 to the polishing sections 201a, 201b.

The inverters 205, 206 turn over semiconductor wafers and are disposed at a position which the holding portions of the transfer robots 204a, 204b can reach. In the present embodiment, the two inverters 205, 206 are separately utilized as a device for handling a dry substrate and a device for handling a wet substrate, respectively.

Each of the cleaning units 207a, 207b, 208a and 208b may be of any type. For example, the cleaning units 207a, 207b provided on a side of the polishing sections 201a, 201bare of a type such that both sides of a semiconductor wafer are wiped with a roller equipped with a sponge, and the cleaning units 208a, 208b provided on a side of the cassettes 202a, 202b are of a type such that a cleaning liquid is supplied to a semiconductor wafer while holding an edge thereof and rotating the wafer within a horizontal plane. The latter also has a function as a drier for centrifugally drying a semiconductor wafer. The cleaning units 207a, 207b can perform a primary cleaning of a semiconductor wafer, and the cleaning units 208a, 208b can perform a secondary cleaning of the semiconductor wafer after the completion of the primary cleaning.

Figure 11:
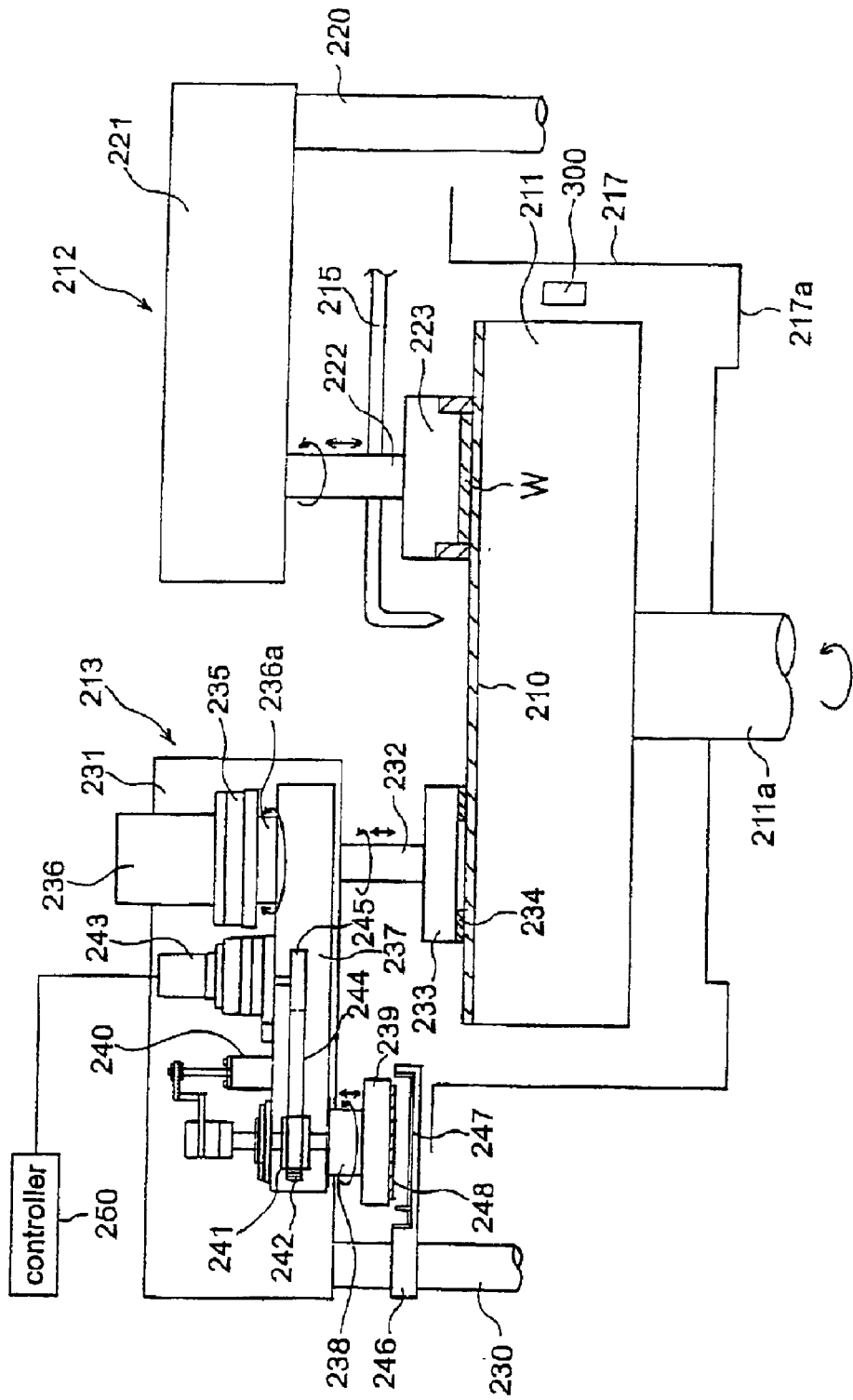
FIG. 11 is a vertical cross-sectional view schematically showing a main part of a polishing section in the polishing apparatus according to the third embodiment of the present invention.
Figure 12:
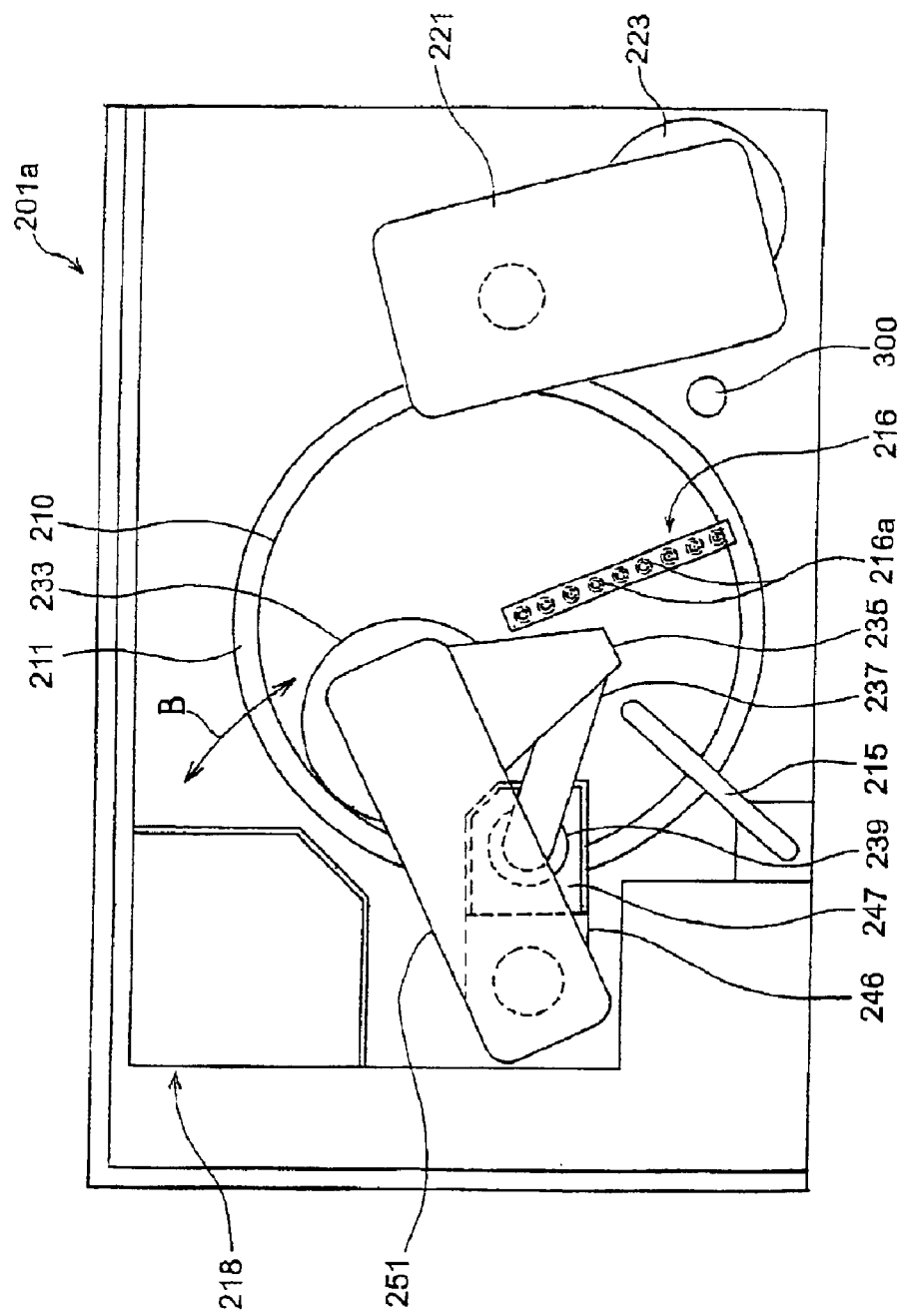
FIG. 12 is a schematic plan view showing a polishing section in the polishing apparatus shown in FIG. 10, illustrating a state of initial surface conditioning of a polishing cloth.
Figure 13:
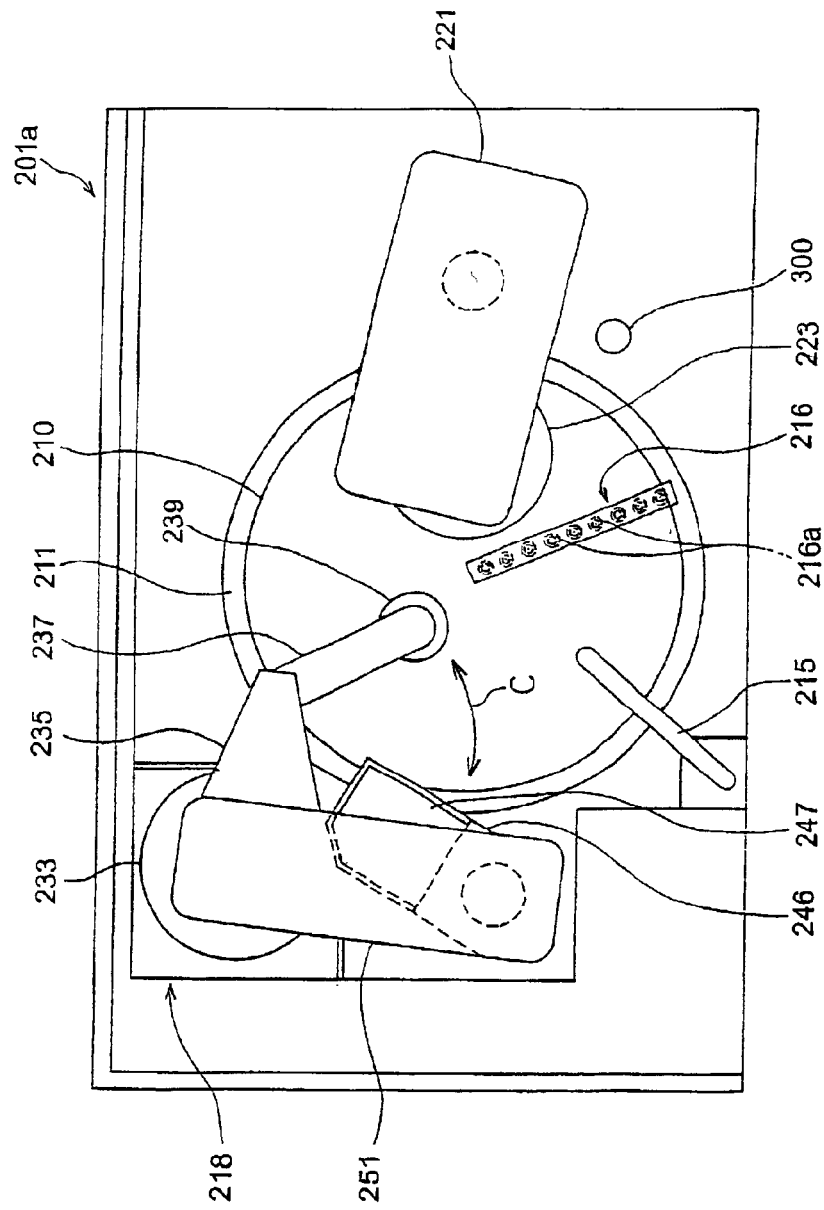
FIG. 13 is a schematic plan view showing the polishing section in the polishing apparatus shown in FIG. 10, illustrating a state of polishing by a top ring.

Next, the aforementioned polishing sections will be described below. FIG. 11 is a vertical cross-sectional view schematically showing a main part of the polishing section 201a shown in FIG. 10, and FIGS. 12 and 13 are schematic plan views showing the polishing section 201a shown in FIG. 10. Only the polishing section 201 a will be described below. However, the following description can be also applied to the polishing section 201b.

As shown in FIG. 11, a surface of a polishing cloth 210 on polishing table 211 constitutes a polishing surface which is brought into sliding contact with a semiconductor wafer W as a workpiece to be polished. The polishing table 211 is coupled to a motor (not shown) disposed below the polishing table 211 via a table shaft 211a, so that the polishing table 211 is rotatable about an axis of the table shaft 211a.

As shown in FIGS. 11 through 13, a polishing liquid/water supply nozzle 215 is disposed above the polishing table 211. A polishing liquid for use during polishing and a dressing liquid (e.g., water) for use during dressing are supplied from the polishing liquid/water supply nozzle 215 onto the polishing cloth 210. The polishing table 211 is surrounded by a frame 217 for recovering the polishing liquid and water, and a tub 217a is provided at a bottom of the frame.

An atomizer 216 for spraying a liquid composed of a mixture of nitrogen gas and pure water or a chemical liquid onto the polishing surface of the polishing cloth is disposed above the polishing table 211. The atomizer 216 comprises a plurality of spray nozzles 216a connected to a nitrogen gas supply source and a liquid supply source. Nitrogen gas from the nitrogen gas supply source and the pure water or a chemical liquid from the liquid supply source are passed through a regulator or air operator valve (not shown) to regulate the pressure to a predetermined value, and are supplied to the spray nozzles 216a in the atomizer 216 in a mixed state.

A mixture of nitrogen gas and pure water or a chemical liquid is brought into a state of ① liquid fine particles, ② solid fine particles as a result of solidification of liquid, or ③ gas as a result of vaporization of liquid (bringing the mixture to the state of ①, ②, or ③ being called atomization), and, in this state, the mixture is sprayed through the spray nozzles 216a in the atomizer 216 toward the polishing cloth 210. Which state of liquid fine particles, solid fine particles, or gas the mixture is sprayed in is determined, for example, depending on pressure or temperature of nitrogen gas and/or pure water or a chemical liquid, or a shape of the nozzles. Therefore, the state of the mixture to be sprayed can be varied, for example, by properly varying pressure or temperature of the nitrogen gas and/or the pure water or a chemical liquid via a regulator or the like, or by properly varying the shape of the nozzles.

The top ring unit 212 comprises a rotatable spindle 220, a top ring head 221 connected to an upper end of the spindle 220, a top ring shaft 222 extended downwardly from a free end of the top ring head 221, and a substantially disk-like top ring 223 connected to a lower end of the top ring shaft 222. When the top ring head 221 is swung by rotation of the spindle 220, the top ring 223 is horizontally moved, and thus can be reciprocated between pusher 214 and a polishing position on the polishing cloth 210, as indicated by an arrow A in FIG. 10.

Further, the top ring 223 is coupled via the top ring shaft 222 to a motor (not shown) provided within the top ring head 221, and is connected to an elevator cylinder (not shown), so that the top ring 223 is vertically movable and is rotatable about the top ring shaft 222. Semiconductor wafer W as a workpiece to be polished is attracted to and held on a lower end face of the top ring 223 by vacuum suction or the like. By these mechanisms, the top ring 223 can rotate and can press the semiconductor wafer W held on its lower end face against the polishing cloth 210 at a desired pressure.

The dressing unit 213 regenerates a surface of the polishing cloth 210 that has been deteriorated as a result of a polishing operation and is disposed at a position opposite to the top ring unit 212 with respect to a center of the polishing table 211. As shown in FIGS. 11 through 13, the dressing unit 213 according to the present embodiment comprises two integrated dressers, i.e., a first dresser 239 and a second dresser 233. As described below, the first dresser 239 is used for dressing the polishing cloth 210 during polishing, and the second dresser 233 is used for initial surface conditioning of the polishing cloth 210 before use for polishing.

The dressing unit 213 comprises a rotatable spindle 230, a dresser head 231 connected to an upper end of the spindle 230, a dresser shaft 232 extended downwardly from a free end of the dresser head 231, and a substantially disk-like second dresser 233 connected to a lower end of the dresser shaft 232. When the dresser head 231 is swung by rotation of the spindle 230, the second dresser 233 is horizontally moved, and thus can be reciprocated between a dressing position on the polishing cloth 210 and a stand-by position located outside of the polishing table 211, as indicated by arrow B in FIGS. 10 and 12. Further, the second dresser 233 is coupled via the dresser shaft 232 to a motor (not shown) provided within the dresser head 231, and is connected to an elevator cylinder (not shown), so that the second dresser 233 is vertically movable and is rotatable about the dresser shaft 232. A dresser cleaning bath 218 for cleaning the second dresser 233 is disposed at the stand-by position located outside of the polishing table 211.

Here, the second dresser 233 comprises a diamond dresser 234 of a pellet or ring type as a dressing element. A plurality of disk-like members with particles such as diamond particles electrodeposited thereon are arranged on a periphery of a lower surface of the second dresser 233 to constitute the diamond dresser 234. A diameter of the second dresser 233 is, for example, 270 mm, which is larger than a diameter (200 mm) of semiconductor wafer W as a workpiece to be polished. Therefore, an area of the polishing surface which is to be dressed by the second dresser 233 is larger than an area of the polishing surface which is to be used for polishing the semiconductor wafer W.

A support section 235 is fixed to a lateral portion of the dresser head 231, and a swinging motor 236 is fixed to a front end of the support section 235. A swing arm 237 is connected to a motor shaft 236a of the swinging motor 236. The swing arm 237 is swung by rotation of the swinging motor 236. This swinging motor 236 is connected to a controller 250 for controlling a speed of the motor (swing speed). The swinging motor 236 constitutes a moving mechanism for moving the first dresser 239, described below, on the polishing surface of the polishing table 211.

The dresser shaft 238 is extended downwardly from a free end side of the swing arm 237, and substantially disk-like first dresser 239 is connected to a lower end of the dresser shaft 238. When the swing arm 237 is swung by actuating the swinging motor 236, the first dresser 239 is horizontally moved, so that the first dresser 239 can be reciprocated between a dressing position on the polishing cloth 210 and a stand-by position located outside of the polishing table 211, as indicated by arrow C in FIG. 13. A support base 246 is fixed below the dresser head 231 of the spindle 230, and a tub-like dresser cleaning bath 247 for cleaning the first dresser 239 is provided in the support base 246 at the stand-by position of the first dresser 239. The support base 246 is swung integrally with the dresser head 231 by rotation of the spindle 230.

The dresser shaft 238 is connected to an air cylinder (pressing mechanism) 240 fixed to the swing arm 237, and is vertically movable by the air cylinder 240. Further, the dresser shaft 238 is connected to a rotating cylinder 241 via a key (not shown). This rotating cylinder 241 has a timing pulley 242 on its periphery. A rotating motor (rotating mechanism) 243 is fixed to the swing arm 237, and the timing pulley 242 is connected via a timing belt 244 to a timing pulley 245 provided in on the rotating motor 243. Therefore, the rotating cylinder 241 -and the dresser shaft 238 are integrally rotated via the timing pulley 245, the timing belt 244, and the timing pulley 242 by driving the rotating motor 243, so that the first dresser 239 is rotated.

Here, the first dresser 239 has a disk-type diamond dresser 248 as a dressing element. A disk-like member with particles such as diamond particles electrodeposited thereon is provided on an entire area of a lower surface of the first dresser 239 to constitute the diamond dresser 248. A diameter of a first dresser 239 is, for example, 100 mm, which is smaller than a diameter (200 mm) of the semiconductor wafer W as a workpiece to be polished. Therefore, an area of the polishing surface which is to be -dressed by the first dresser 239 is smaller than an area of the polishing surface which is to be used for polishing the semiconductor wafer W.

Thus, the dressing unit according to the present embodiment has a construction such that two dressers for different purposes, and a cleaning bath for one of the dressers, have been integrated with one another. This construction can reduce necessary space for the polishing apparatus.

Figure 14:
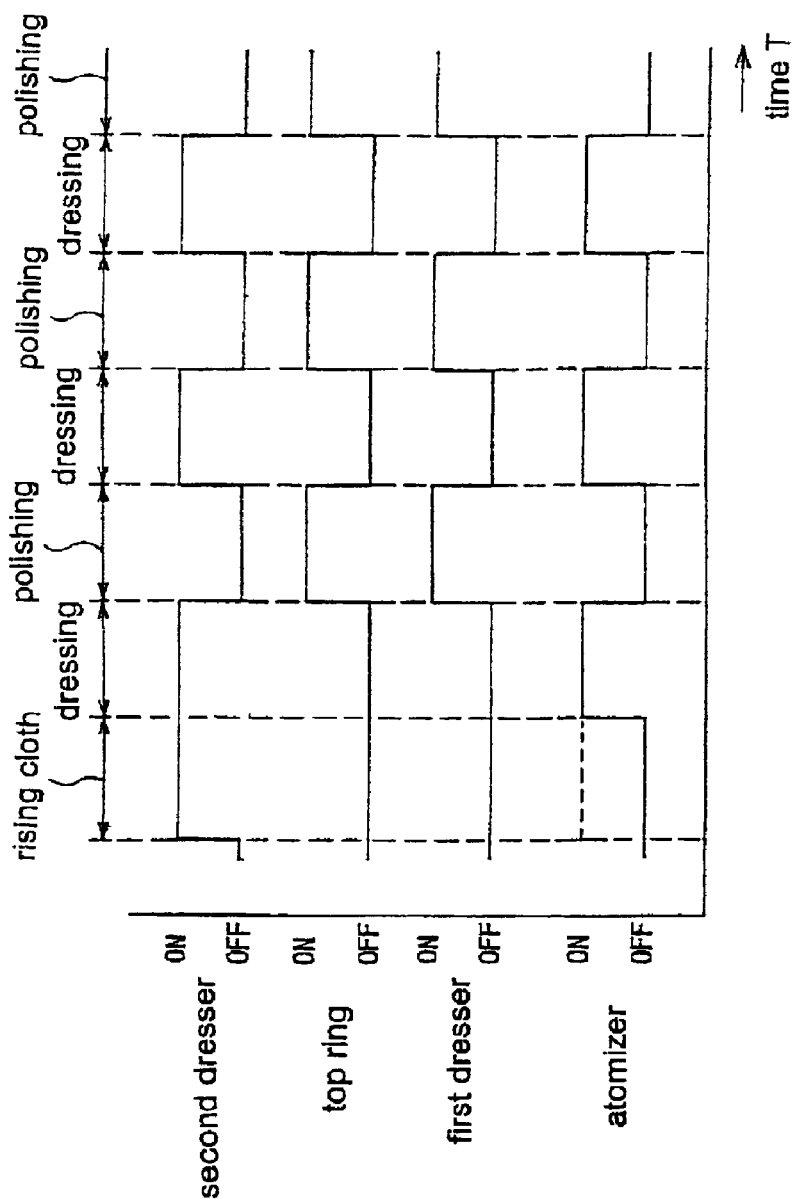
FIG. 14 is a timing chart showing an example of a series of operations in the polishing section shown in FIG. 11.
Figure 15:
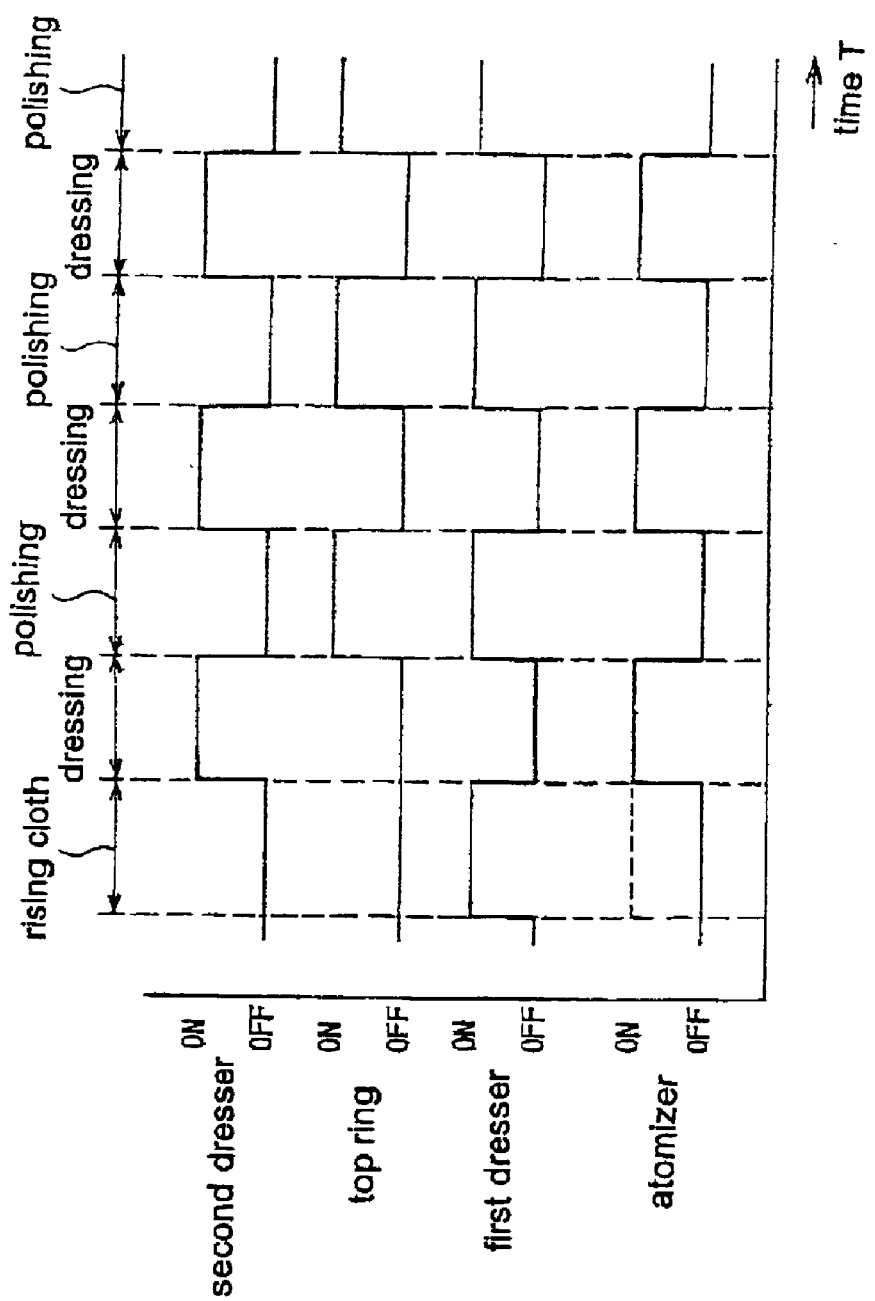
FIG. 15 is a timing chart showing an example of a series of operations in the polishing section shown in FIG. 11.
Figure 16:
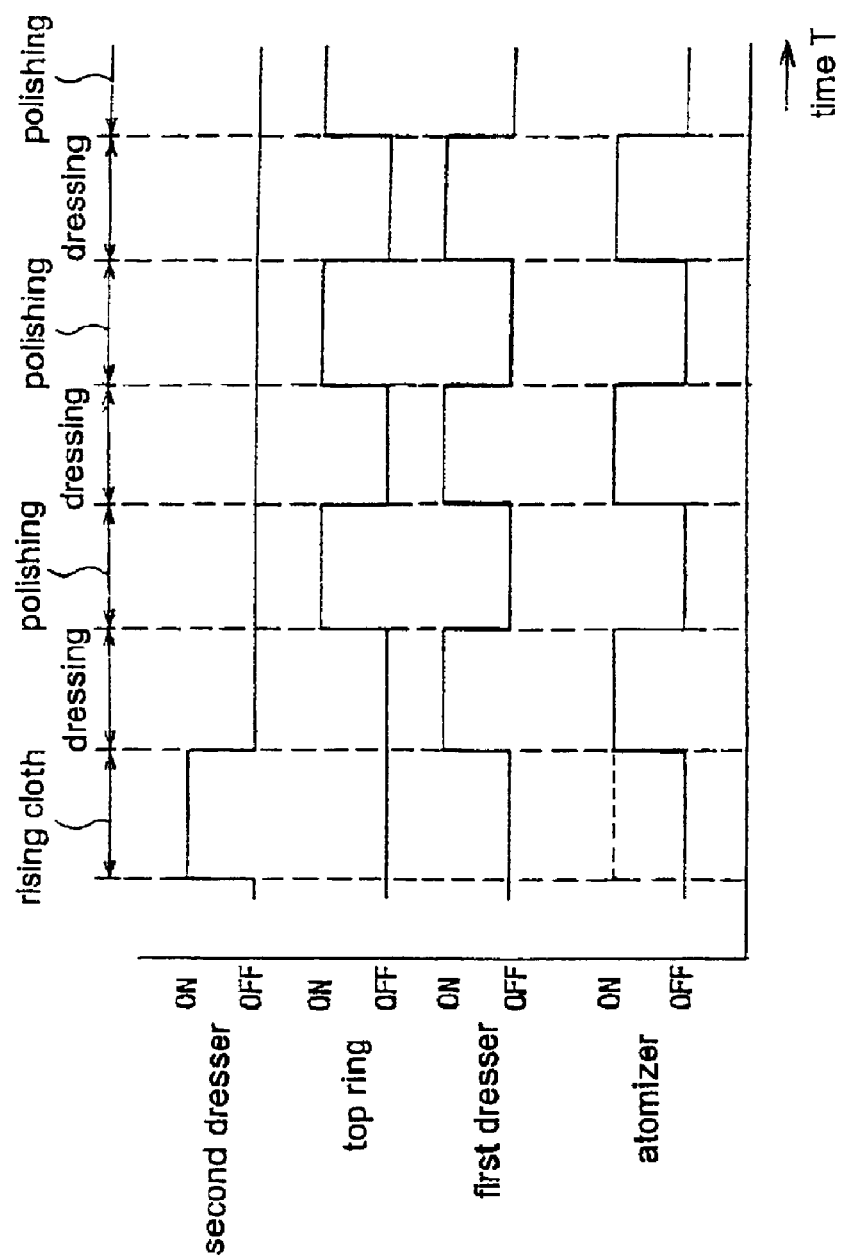
FIG. 16 is a timing chart showing an example of a series of operations in the polishing section shown in FIG. 11.

Next, an operation of polishing semiconductor wafers, and dressing, by the polishing apparatus thus constructed will be described below. FIGS. 14 through 16 are timing charts showing a series of operations in the present embodiment.

An example shown in FIG. 14 will be described below.

First, initial surface conditioning of a polishing cloth is performed prior to performing a polishing operation. A surface of the polishing cloth 210 is thinly shaved by the second dresser 233 of the dressing unit 213 for performing the initial surface conditioning of the polishing cloth before polishing. FIG. 12 shows this state. In this case, the dresser head 231 is moved onto the polishing cloth 210 at a dressing position by rotation of the spindle 230. Thereafter, the second dresser 233 and the polishing table 211 are independently rotated, and the diamond dresser 234 held on the second dresser 233 is brought into abutment with the polishing cloth 210 under a predetermined pressure. At this time, a moment or so before the diamond dresser 234 is brought into contact with the polishing cloth 210, water is supplied from the polishing liquid/water supply nozzle 215 onto the upper surface of the polishing cloth 210 to wash away a used polishing liquid remaining on the polishing cloth 210. Thus, the second dresser 233 can regenerate an entire polishing surface of the polishing cloth 210.

Next, dressing before polishing is performed by the second dresser 233. During, before, or after dressing by the second dresser 233, nitrogen gas and pure water or a chemical liquid are supplied to the atomizer 216 under a predetermined pressure and temperature, and a mixed liquid composed of the pure water or the chemical liquid and the nitrogen gas is sprayed from the spray nozzles 216a in the atomizer 216 toward the polishing cloth 210. Thus, the mixed liquid is sprayed in an atomized state on the polishing cloth 210, whereby a polishing liquid and polishing wastes remaining on the polishing cloth 210 are scattered toward an outer portion of the polishing table 211. In particular, polishing liquid and polishing wastes that have fallen into recesses in the polishing cloth can be blown away from the recesses by gas contained in the mixed liquid, and, further, can be washed away by pure water or chemical liquid. Thus, polishing liquid and polishing wastes, which remain on the polishing cloth 210 to cause a scratch, can be effectively removed. This atomization can be performed at any time during dressing by the second dresser 233, or at any time before or after dressing by the second dresser 233. Incidentally, as indicated by a dashed line in FIGS. 14 through 16, atomization may also be performed at a time of initial surface conditioning of the polishing cloth before polishing.

Water supplied from the polishing liquid/water supply nozzle to the polishing cloth 210 and the mixed liquid sprayed from the atomizer 216 onto the polishing cloth 210 are scattered to an outer portion of the polishing table 211 by centrifugal force produced by rotation of the polishing table 211, and are recovered in the tub 217a provided at the lower part of the frame 217. After completion of dressing, the second dresser 233 is returned to the stand-by position by swinging the dresser head 231, and then the second dresser is cleaned in the dresser cleaning bath 218 provided in this stand-by position.

A polishing process of a semiconductor wafer is then performed. During polishing of the semiconductor wafer, not only polishing of semiconductor wafer W by the top ring 223 but also dressing by the first dresser 239 in the dressing unit 213 is performed. FIG. 13 shows this state. In this case, the spindle 220 is rotated to move the top ring head 221 onto the polishing cloth 210 in a polishing position. Thereafter, the top ring 223 and the polishing table 211 are independently rotated, and the semiconductor wafer W held on the top ring 223 and the polishing table 211 are relatively moved to press the semiconductor wafer W held on a lower surface of the top ring 223 against the polishing cloth 210 on the polishing table 211. At this time, a polishing liquid is supplied from the polishing liquid/water supply nozzle 215 onto the upper surface of the polishing cloth 210. For example, a suspension of fine polishing particles in an alkali solution may be used. In this case, the semiconductor wafer W is polished by a combined effect of a chemical polishing effect attained by the alkali and a mechanical polishing effect attained by the polishing particles. Polishing liquid used for the polishing is scattered to an outer portion of the polishing table 211 by a centrifugal force produced by the rotation of the polishing table 211, and is recovered in a tub 217a provided at the lower part of the frame 217.

During such polishing, the swinging motor 236 fixed to the support section 235 in the dressing unit 213 is actuated to swing the swing arm 237, thereby moving the first dresser 239 housed in the dresser cleaning bath 247 in the support base 246 onto the polishing cloth 210. The first dresser 239 is then rotated by the rotating motor 243 to bring the diamond dresser 248 held on the first dresser into abutment with the polishing cloth 210 under a predetermined pressure for dressing the polishing cloth 210.

During this dressing, the swing arm 237 and the first dresser 239 are swung by the swinging motor 236. The controller 250 controls motor speed of the swinging motor 236 so that a swing speed of the first dresser 239 varies depending on a position of the first dresser 239 on the polishing table 211. Swing speed of the first dresser 239 is controlled based on a profile of a surface, to be polished, of semiconductor W. That is, swing speed is controlled so as to be low at a position of the polishing cloth 210 for polishing an area in which a film thickness to be polished is large, and so as to be high at a position of the polishing cloth 210 for polishing an area in which a film thickness to be polished is small. Therefore, a polishing cloth used for polishing an area in which a film thickness to be polished is large is dressed more than a polishing cloth used for polishing an area in which a film thickness to be polished is small. Thus, in the top ring 223, an area in which a film thickness to be polished is large can be polished relatively more, and an area in which a film thickness to be polished is small can be polished relatively less. Consequently, this can eliminate excessive polishing or insufficient polishing. A dressing time of the first dresser 239 during polishing of semiconductor wafer W may be selected as desired. The controller 250 in the present embodiment controls swing speed of the first dresser 239. Alternatively, in order to eliminate excessive polishing or insufficient polishing, the rotating motor (rotating mechanism) 243 or the air cylinder (pressing mechanism) 240 may be controlled to control a rotational speed or a pressing load of the first dresser 239.

In another example shown in FIG. 15, initial surface conditioning of a polishing cloth before polishing is performed by the first dresser 239 instead of the second dresser 233, and other features in this example are the same as the example shown in FIG. 14. Thus, the first dresser 239 can be used for initial surface conditioning. In still another example shown in FIG. 16, the second dresser 233 is used only at a time of replacement of polishing cloth 210, and subsequent dressing is performed by the first dresser 239. Since a polishing cloth 210 before use is not dressed at all, an amount of time necessary for dressing at a time of initial surface conditioning is long. On the other hand, in a case of a polishing cloth 210 that has been dressed once, polishing efficiency can be increased simply by dressing in a short amount of time. Therefore, in the example shown in FIG. 16, initial surface conditioning is performed in a short amount of time by a large-diameter second dresser 233, and dressing of portions necessary to be dressed in the polishing cloth is performed by a small-diameter first dresser 239. This dressing method is suitable for use in a case where dressing cannot be performed during polishing because of reasons based on a polishing process being performed, such as combination of a workpiece to be polished with a used polishing liquid.

As described above, in the polishing apparatus according to the present invention, since the first dresser 239 having a diameter smaller than semiconductor wafer W, as the workpiece to be polished, is used, an area to be dressed can be varied as desired within a polishing surface. Thus, an amount of dressing can be adjusted at a desired position of the polishing surface. Therefore, polishing can be properly performed in accordance with a profile (film thickness distribution) of a surface, to be polished, of semiconductor wafer W.

Here, for example, distribution of film thickness to be polished on semiconductor wafer W, that is, a profile of a surface, to be polished, of the semiconductor wafer W, may be previously assumed based on a film deposition method or a film deposition apparatus, and at least one of swing speed, rotational speed, and pressing load of the first dresser 239 may be controlled according to a program based on this profile. Further, as shown in FIGS. 11 through 13, a film thickness measuring unit 300 for measuring a profile of a surface, to be polished, of semiconductor wafer W before or during polishing may be provided, and at least one of swing speed, rotational speed, and pressing load of the first dresser 239 may be controlled for each of semiconductor wafers based on a actual profile of a surface, to be polished, of semiconductor wafer W, which is measured by the film thickness measuring unit. Thus, when the film thickness measuring unit 300 has been provided, polishing can be performed more properly for each of plural semiconductor wafers. When a profile of a surface, to be polished, of semiconductor wafer W is measured by the film thickness measuring unit 300, a pad profiler for measuring a profile of the polishing surface of the polishing cloth 210 may additionally be provided to measure the profile of the polishing surface, and at least one of swing speed, rotational speed, and pressing load of the first dresser 239 may be controlled based on both of the profile of the surface, to be polished, of the semiconductor wafer W and the profile of the polishing surface of the polishing cloth 210.

Figure 17:
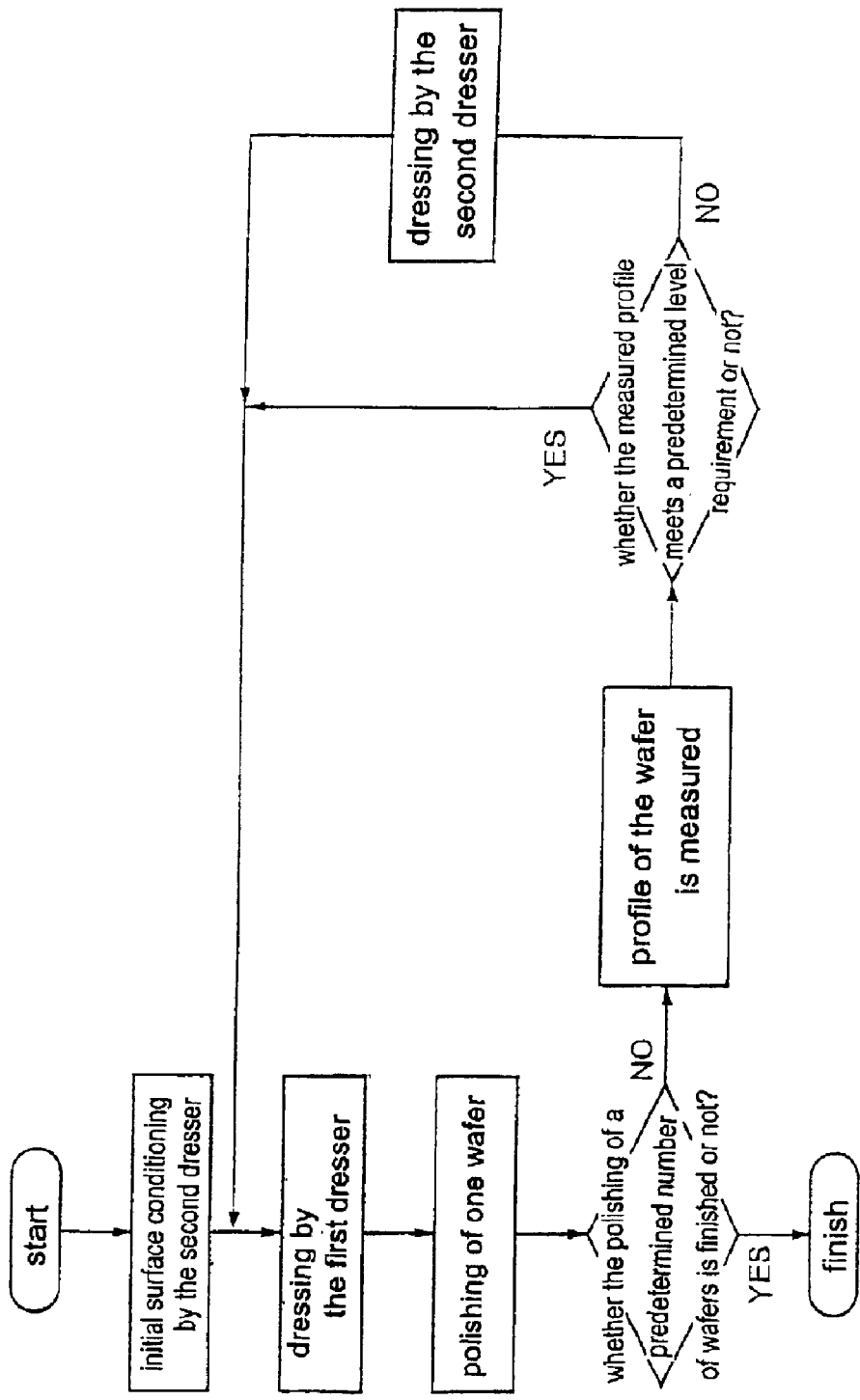
FIG. 17 is a flow chart showing an example of a series of operations in the polishing section shown in FIG. 11.

Further, dressing of the polishing cloth 210 may be performed according to a flow chart as shown in FIG. 17. That is, after initial surface conditioning is performed by the second dresser 233, the polishing cloth 210 is dressed by the first dresser 239, and then a semiconductor wafer W is polished. After polishing of the semiconductor wafer W, it is decided whether or not polishing performance of the polishing cloth 210 is properly maintained.

When polishing performance is not properly maintained, a polishing surface of the polishing cloth 210 in its entirety is dressed by the large-diameter second dresser 233. In order to decide whether or not polishing performance is properly maintained, a profile of a surface, to be polished, of semiconductor wafer W is measured with the film thickness measuring unit 300, and it is decided whether or not measured profile meets a predetermined level requirement. Thus, in a case where the polishing surface has been locally worn, substantially an entire area of the polishing surface is dressed by the large-diameter second dresser 233, and hence, even when the polishing cloth 210 has been locally worn due to dressing of the first dresser 239, a state of the polishing cloth 210 can be reset by the second dresser 233.

Next, a polishing apparatus according to a fourth embodiment of the present invention will be described below with reference to FIGS. 18 through 20. Like parts and components in the present embodiment are designated by the same reference numerals as those shown in the third embodiment. Parts not particularly referred to in the following description are the same as parts in the third embodiment.

Figure 18:
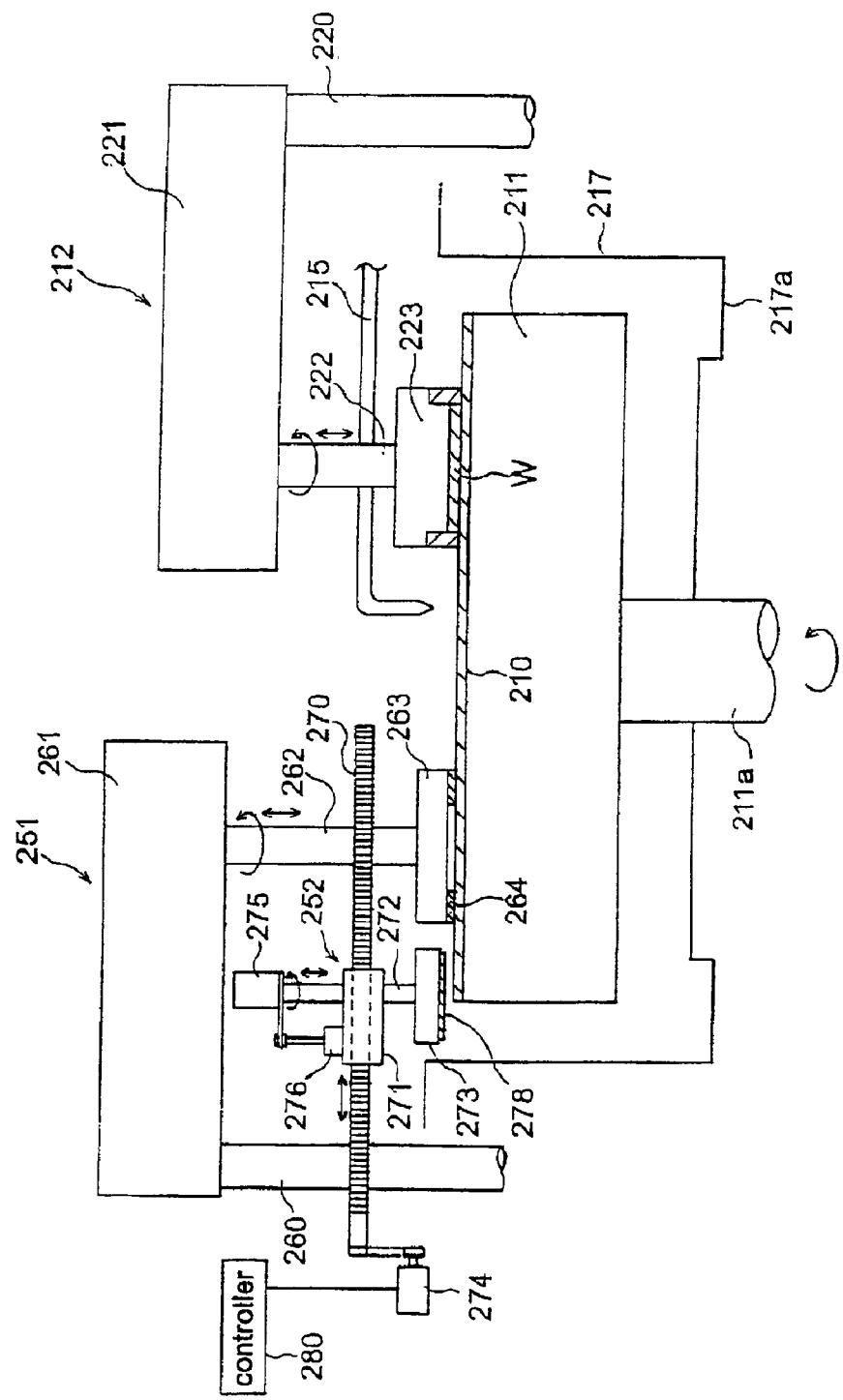
FIG. 18 is a vertical cross-sectional view schematically showing a main part of a polishing section in a polishing apparatus according to a fourth embodiment of the present invention.
Figure 19:
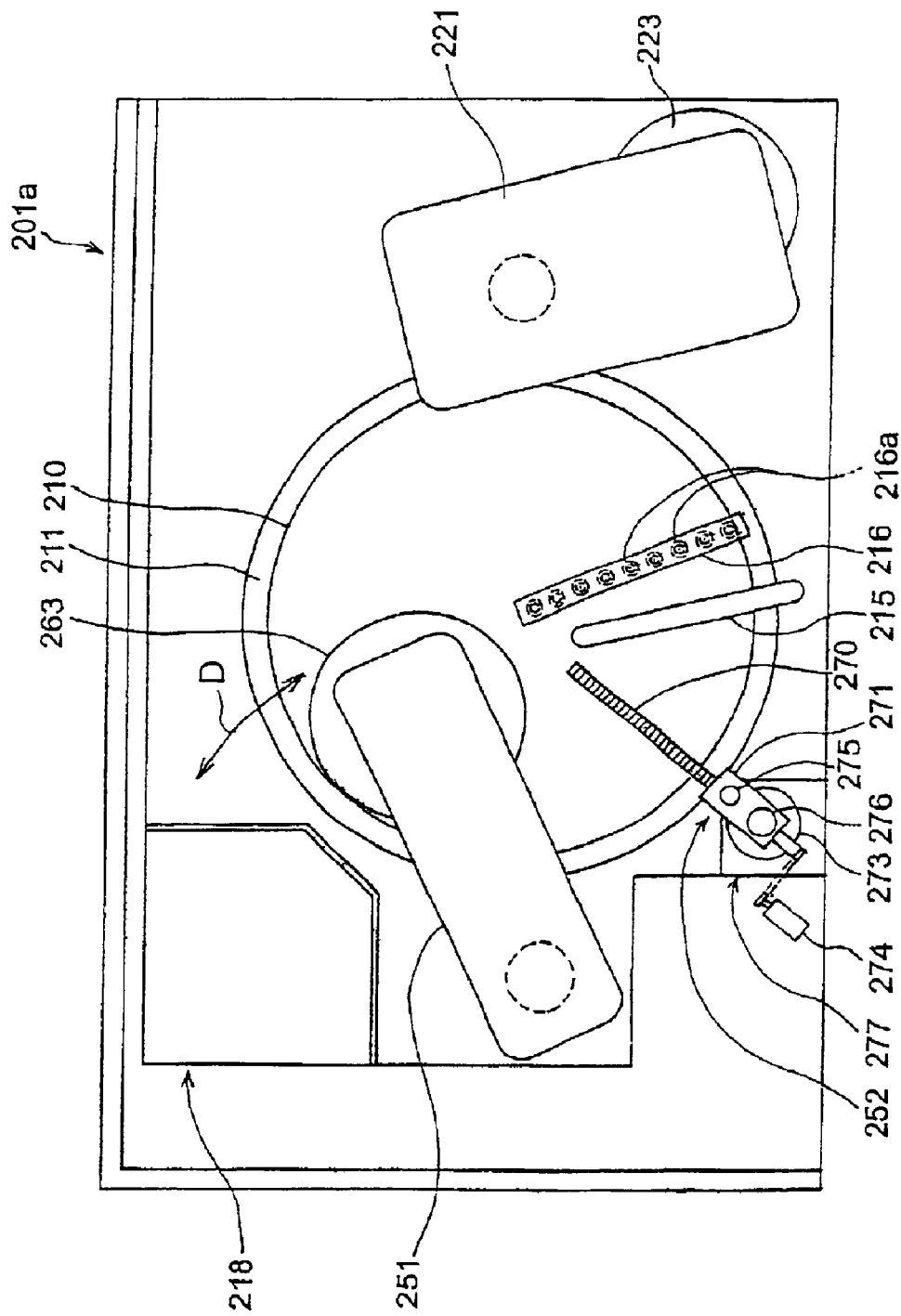
FIG. 19 is a schematic plan view showing a polishing section in the polishing apparatus according to the fourth embodiment of the present invention, illustrating a state of initial surface conditioning of a polishing cloth.
Figure 20:
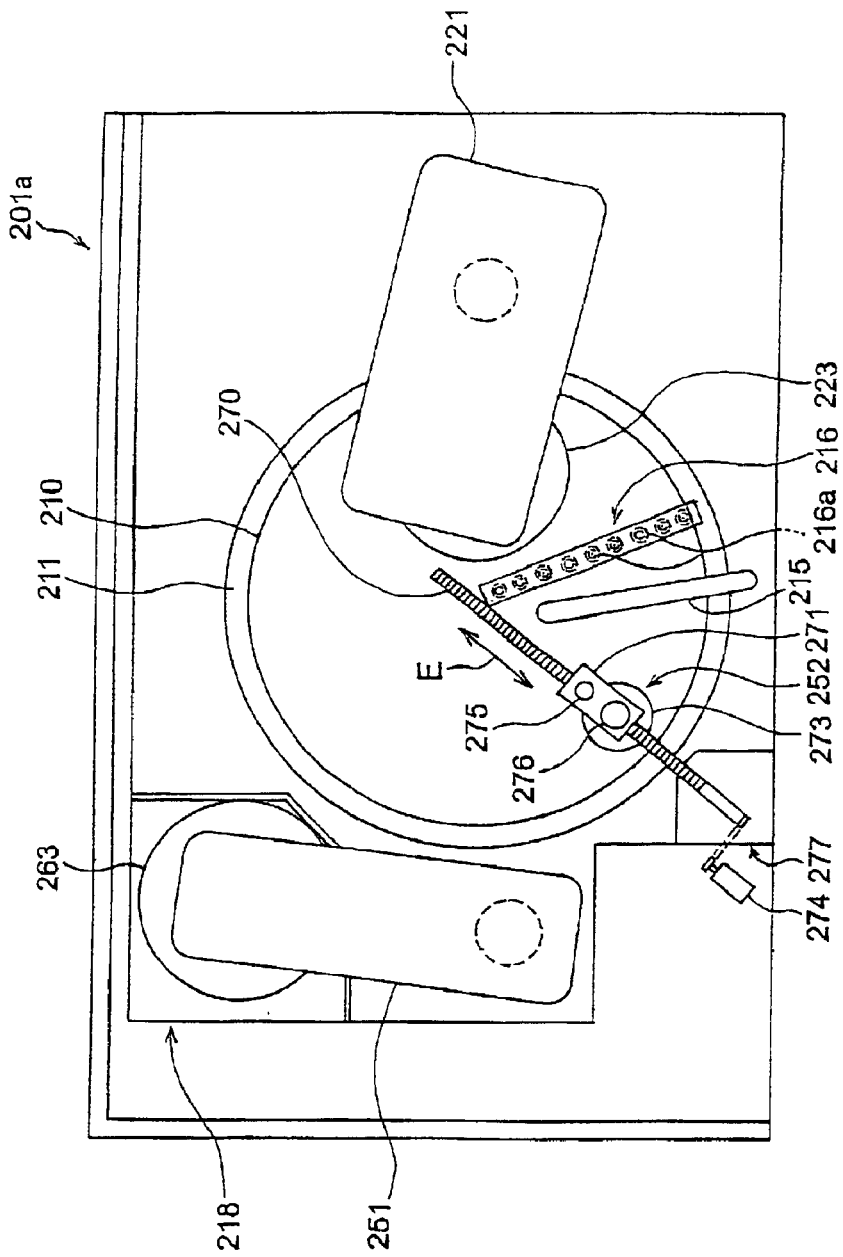
FIG. 20 is a schematic plan view showing the polishing section in the polishing apparatus according to the fourth embodiment of the present invention, illustrating a state of polishing by a top ring.
Figure 21:
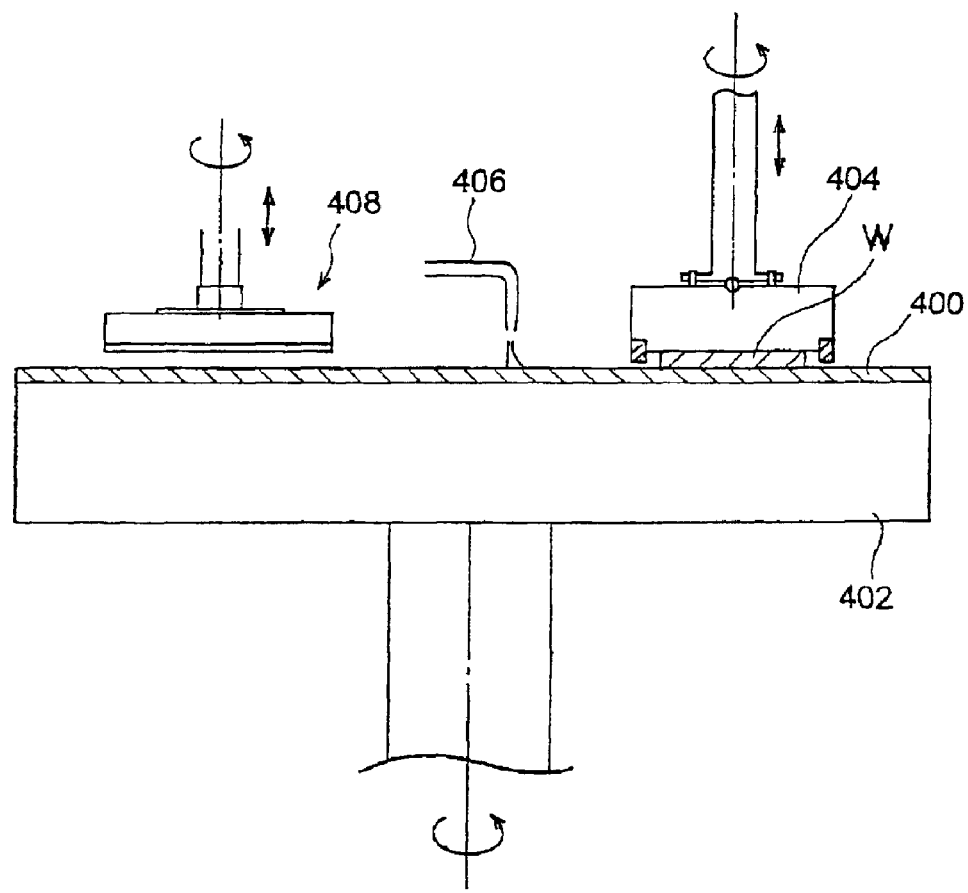
FIG. 21 is a schematic cross-sectional view showing a conventional polishing apparatus.

FIG. 18 is a vertical cross-sectional view schematically showing a main part of a polishing section in the polishing apparatus according to the present embodiment of the present invention, and FIGS. 19 and 20 are schematic plan views showing the polishing section in the polishing apparatus according to the present embodiment of the present invention.

As shown in FIGS. 18 through 20, the polishing apparatus according to the present embodiment separately comprises a first dressing unit 252 having a first dresser 273 for dressing a polishing cloth during a polishing operation, and a second dressing unit 251 having a second dresser 263 for initial surface conditioning of the polishing cloth before use during polishing.

The first dressing unit 252 comprises a horizontally extended ball screw 270, a dresser shaft 272 extended downwardly from a nut 271 provided on the ball screw 270, and a substantially disk-like first dresser 273 connected to a lower end of the dresser shaft 272. A ball screw drive motor 274 is connected to one end of the ball screw 270. The ball screw 270 is rotated by actuating the ball screw drive motor 274, and the nut 271 provided on the ball screw 270, and the first dresser 273 connected to the nut 271, are horizontally moved via action of the ball screw 270. Thus, the first dresser 273 can be reciprocated between a dressing position on polishing cloth 210 and a stand-by position located outside of polishing table 211, as indicated by an arrow E in FIG. 20. This ball screw drive motor 274 is connected to a controller 280 for controlling speed of the motor (swing speed). The ball screw drive motor 274 constitutes a moving mechanism for moving the first dresser 273 along the polishing table 211.

Further, the first dresser 273 is coupled to a rotating motor (rotating mechanism) 275 fixed to the nut 271 of the ball screw 270 via the dresser shaft 272, and is connected to an air cylinder (a pressing mechanism) 276 via the dresser shaft 272. Therefore, the first dresser is vertically movable and is rotatable about the dresser shaft 272. A dresser cleaning bath 277 for cleaning the first dresser 273 is disposed in the stand-by position located outside of the polishing table 211.

Here, as with the third embodiment, the first dresser 273 comprises a disk-type diamond dresser 278 as a dressing element. A diameter of the first dresser 273 is smaller than that of a semiconductor wafer W as a workpiece to be polished. Therefore, an area of a polishing cloth dressed by the first dresser 273 is smaller than an area of a polishing surface that is to be used for polishing the semiconductor wafer W.

The second dressing unit 251 comprises a rotatable spindle 260, a dresser head 261 connected to an upper end of the spindle 260, a dresser shaft 262 extended downwardly from a free end of the dresser head 261, and a substantially disk-like second dresser 263 connected to a lower end of the dresser shaft 262. When the dresser head 261 is swung by rotation of the spindle 260, the second dresser 263 is horizontally moved and thus can be reciprocated between a dressing position on the polishing cloth 210 and a stand-by position located outside of the polishing table 211, as indicated by an arrow D in FIG. 19. Further, the second dresser 263 is coupled via the dresser shaft 262 to a motor (not shown) provided within the dresser head 261, and is connected to an elevator cylinder (not shown), so that the second dresser 263 is vertically movable and is rotatable about the dresser shaft 262.

Here, as with the third embodiment, the second dresser 263 comprises a pellet-type diamond dresser 264 as a dressing element. A diameter of the second dresser 263 is larger than that of semiconductor wafer W as a workpiece to be polished. Therefore, an area of a polishing cloth dressed by the second dresser 263 is larger than an area of a polishing surface that is to be used for polishing the semiconductor wafer W.

Next, an operation of polishing semiconductor wafers and dressing a polishing cloth by the polishing apparatus thus constructed will be described below. Only operation corresponding to the example, of the third embodiment, shown in FIG. 14 will be described. However, it is needless to say that the following description can be applied to operation corresponding to the examples shown in FIGS. 15 through 17.

First, initial surface conditioning of a polishing cloth prior to performing a polishing operation will be described. A surface of polishing cloth 210 is thinly shaved by the second dresser 263 in the second dressing unit 251 for initial surface conditioning of the polishing cloth before polishing. FIG. 19 shows this state. In this case, the dresser head 261 is moved to a dressing position on the polishing cloth 210 by rotation of the spindle 260. Thereafter, the second dresser 263 and the polishing table 211 are independently rotated, and the diamond dresser 264 held on the second dresser 263 is brought into abutment with the polishing cloth 210 under a predetermined pressure. Thus, the second dresser 263 can regenerate an entire polishing surface of the polishing cloth 210. After completion of dressing, the second dresser 263 is returned to a stand-by position by swinging the dresser head 261, and then the second dresser is cleaned in the dresser cleaning bath 218 provided in this stand-by position.

Next, polishing of a semiconductor wafer is performed. During polishing of a semiconductor wafer, not only polishing of a semiconductor wafer W by the top ring 223, but also dressing by the first dresser 273 in the first dressing unit 252, is performed. FIG. 20 shows this state. In this case, the spindle 220 is rotated to move the top ring head 221 above the polishing cloth 210 in a polishing position. Thereafter, the top ring 223 and the polishing table 211 are independently rotated, and the semiconductor wafer W held on the top ring 223 and the polishing table 21 1 are relatively moved to press the semiconductor wafer W held on a lower surface of the top ring 223 against the polishing cloth 210 on the polishing table 211. At this time a polishing liquid is supplied from the polishing liquid/water supply nozzle 215 onto an upper surface of the polishing cloth 210, for thereby polishing the semiconductor wafer W.

During such polishing, the ball screw drive motor 274 in the first dressing unit 252 is actuated to move the first dresser 273, housed in the dresser cleaning bath 277, onto the polishing cloth 210. The first dresser 273 is then rotated by the rotating motor 275 to bring the diamond dresser 278 held on the first dresser 273 into abutment with the polishing cloth 210 under a predetermined pressure for dressing the polishing cloth 210.

During this dressing, the first dresser 273 is moved along the polishing table 211 in a radial direction of the table 211 by the ball screw drive motor 274. The controller 280 controls motor speed of the ball screw drive motor 274 so that swing speed of the first dresser 273 varies depending on a position of the first dresser 273 above the polishing table 211. Swing speed of the first dresser 273 is controlled based on the a profile of a surface, to be polished, of the semiconductor wafer W. That is, swing speed is controlled so as to be low at a position of the polishing cloth 210 for polishing an area in which a film thickness to be polished is large, and so as to be high at a position of the polishing cloth 210 for polishing an area in which a film thickness to be polished is small. Therefore, a polishing cloth used for polishing an area in which a film thickness to be polished is large is dressed more than a polishing cloth used for polishing an area in which a film thickness to be polished is small. Thus, in the top ring 223, an area in which a film thickness to be polished is large can be polished relatively more, and an area in which a film thickness to be polished is small can be polished relatively less. Consequently, this can eliminate excessive polishing or insufficient polishing. A dressing time of the first dresser 273 during polishing of the semiconductor wafer W may be selected as desired. The controller 250 in the present embodiment controls swing speed of the first dresser 273. Alternatively, in order to eliminate excessive polishing or insufficient polishing, the rotating motor (rotating mechanism) 275 or the air cylinder (pressing mechanism) 276 may be controlled to control rotational speed or pressing load of the first dresser 273.

As described above, in the polishing apparatus according to the present invention, since the first dresser 273 having a diameter smaller than that of semiconductor wafer W as the workpiece to be polished is used, an area to be dressed can be varied as desired within a polishing surface. Thus, an amount of dressing can be adjusted at a desired position of the polishing surface. Therefore, polishing can be properly performed in accordance with a profile (film thickness distribution) of a surface, to be polished, of semiconductor wafer W.

As with the third embodiment, in the present embodiment, for example, a profile of a surface, to be polished, of semiconductor wafer W may be previously assumed based on a film deposition method or a film deposition apparatus, and at least one of swing speed, rotational speed, and pressing load of the first dresser 273 may be controlled according to a program based on this profile. Alternatively, a film thickness measuring unit for measuring a profile of a surface, to be polished, of semiconductor wafer W before polishing may be provided, and at least one of swing speed, rotational speed, and pressing load of the first dresser 273 may be controlled for each of plural semiconductor wafers based on an actual profile of a surface, to be polished, of semiconductor wafer W, which is measured by the film thickness measuring unit.

In the third and fourth embodiments, a diamond dresser is used as the dressing element in both of the second dresser and the first dresser. However, the dressing element is not limited to a diamond dresser. For example, not only pellet-type or disk-type diamond dressers but also ring-type diamond dressers may be used. Further, brush dressers may also be used. It is also possible to use a proper combination of these various dressing elements.

As described above, according to the third and fourth embodiments of the present invention, since a dresser having a diameter smaller than that of a workpiece to be polished is used, an area to be dressed can be varied as desired within a polishing surface. Therefore, a polishing cloth used for polishing an area in which a film thickness to be polished is large is dressed more than a polishing cloth used for polishing an area in which a film thickness to be polished is small. Thus, an area in which a film thickness to be polished is large can be polished relatively more, and an area in which a film thickness to be polished is small can be polished relatively less. Consequently, polishing can be properly performed in accordance with a profile (film thickness distribution) of a surface, to be polished, of a workpiece.

It is needless to say that the present invention is not limited to the above-described embodiments and may be practiced in various different forms without departing from the scope of the technical idea.

Industrial Applicability

The present invention is suitable for use in a dresser for dressing a surface of a polishing cloth attached to an upper surface of a polishing table in a polishing apparatus for polishing a workpiece such as a semiconductor wafer to a flat mirror finish.

What is claimed is:

1. A polishing apparatus for polishing a workpiece, comprising:
   a table for providing a polishing surface;
   a first dresser having a contact surface for contacting said polishing surface during a first dressing operation;

a second dresser having a contact surface for contacting said polishing surface during a second dressing operation;
a sensor for measuring a profile of said polishing surface; and
a controller for controlling a dressing process of said first dresser,
wherein said first dresser and said second dresser are to perform said first dressing operation and said second dressing operation at different times, respectively.

2. A polishing apparatus comprising:
a polishing table having a polishing surface;
a top ring for pressing a workpiece against said polishing surface so as to polish the workpiece;
at least two dressers for dressing said polishing surface, one of said at least two dressers comprising a diamond dresser; and
a controller for performing an initial surface conditioning of said polishing surface with said one of said at least two dressers at a time prior to polishing of any workpiece so as to thinly shave said polishing surface, and for dressing said polishing surface with another of said at least two dressers after the workpiece has been polished.

3. The polishing apparatus according to claim 2, wherein
said one of said at least two dressers is for performing the initial surface conditioning of said polishing surface only at the time prior to polishing of any workpiece, and
said another of said at least two dressers is for dressing said polishing surface only after a workpiece has been polished.

4. The polishing apparatus according to claim 2, wherein said at least two dressers are different in size relative to one another.

5. A polishing apparatus comprising:
a polishing table having a polishing surface;
a top ring for pressing a workpiece against said polishing surface so as to polish the workpiece; and
at least two dressers for dressing said polishing surface,
wherein one of said at least two dressers is to perform an initial surface conditioning of said polishing surface at a time prior to polishing of any workpiece, and another of said at least two dressers is for dressing said polishing surface after the workpiece has been polished,
wherein at least one of said at least two dressers has a diameter greater than a diameter of the workpiece to be polished, and
wherein at least one of said at least two dressers has a diameter smaller than the diameter of the workpiece to be polished.

6. The polishing apparatus according to claim 2, wherein one of said at least two dressers is to move across said polishing surface while dressing said polishing surface.

7. The polishing apparatus according to claim 2, wherein at least one of said at least two dressers is to dress said polishing surface while the workpiece is not being polished.

8. The polishing apparatus according to claim 2, wherein said at least two dressers comprise diamond dressers.

9. The polishing apparatus according to claim 2, wherein said another of said at least two dressers comprises a brush dresser.

10. A polishing apparatus comprising:
a polishing table having a polishing surface;
a top ring for pressing a workpiece against said polishing surface so as to polish the workpiece; and
at least two dressers for dressing said polishing surface,
wherein one of said at least two dressers is to perform an initial surface conditioning of said polishing surface at a time prior to polishing of any workpiece, and another of said at least two dressers is for dressing said polishing surface after the workpiece has been polished, and
wherein one of said at least two dressers is to have at least one of its swing speed, rotational speed, and pressing load controlled based on a profile of a surface, to be polished, of the workpiece.

11. A polishing apparatus comprising:
a polishing table having a polishing surface;
a top ring for pressing a workpiece against said polishing surface so as to polish the workpiece; and
at least two dressers for dressing said polishing surface,
wherein one of said at least two dressers is to perform an initial surface conditioning of said polishing surface at a time prior to polishing of any workpiece, and another of said at least two dressers is for dressing said polishing surface after the workpiece has been polished, and
wherein one of said at least two dressers is to have at least one of its swing speed, rotational speed, and pressing load controlled based on a profile of said polishing surface.

12. A polishing apparatus comprising:
a polishing table having a polishing surface;
a top ring for pressing a workpiece against said polishing surface so as to polish the workpiece;
at least two dressers for dressing said polishing surface, with one of said at least two dressers comprising a diamond dresser; and
a controller for performing a dressing operation with said one of said at least two dressers after a plurality of workpieces has been polished, and for dressing said polishing surface with another of said at least two dressers each time a workpiece has been polished.

13. The polishing apparatus according to claim 2, wherein said one of said at least two dressers is to dress said polishing surface when a polishing performance is not properly maintained.

14. The polishing apparatus according to claim 13, wherein
said one of said at least two dressers is to dress said polishing surface when the polishing performance is determined to not be properly maintained based on a profile of a surface, to be polished, of the workpiece not meeting a predetermined level requirement.

15. The polishing apparatus according to claim 2, further comprising:
an atomizer for spraying a fluid onto said polishing surface so as to remove a polishing waste present on said polishing surface.

16. The polishing apparatus according to claim 15, wherein
said atomizer is to spray a fluid composed of a mixture of gas and liquid.

17. The polishing apparatus according to claim 15, wherein
said atomizer is for spraying the fluid onto said polishing surface while the workpiece is not being polished.

18. The polishing apparatus according to claim 15, wherein
said atomizer is for spraying the fluid onto said polishing surface while said polishing surface is being dressed.

* * * * *

UNITED STATES PATENT AND TRADEMARK OFFICE
CERTIFICATE OF CORRECTION

PATENT NO. : 6,939,208 B2
DATED : September 6, 2005
INVENTOR(S) : Kenji Kamimura et al.

It is certified that error appears in the above-identified patent and that said Letters Patent is hereby corrected as shown below:

<u>Title page,</u>
Item [30], Foreign Application Priority Data, change
"Oct. 24, 2000  (JP)……………..2000-32490" to
-- Oct. 24, 2000 (JP)……………..2000-324290 --.

Signed and Sealed this

Sixth Day of December, 2005

JON W. DUDAS
*Director of the United States Patent and Trademark Office*